United States Patent
Zeng et al.

(10) Patent No.: US 12,284,817 B2
(45) Date of Patent: Apr. 22, 2025

(54) TRENCH-GATED HETEROSTRUCTURE AND DOUBLE-HETEROSTRUCTURE ACTIVE DEVICES

(71) Applicant: MaxPower Semiconductor Inc., San Jose, CA (US)

(72) Inventors: Jun Zeng, Torrance, CA (US); Mohamed N. Darwish, Campbell, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 347 days.

(21) Appl. No.: 16/006,693

(22) Filed: Jun. 12, 2018

(65) Prior Publication Data

US 2018/0366569 A1 Dec. 20, 2018

Related U.S. Application Data

(63) Continuation-in-part of application No. 15/620,547, filed on Jun. 12, 2017, now abandoned.

(Continued)

(51) Int. Cl.
*H01L 21/324* (2006.01)
*H01L 21/02* (2006.01)
(Continued)

(52) U.S. Cl.
CPC ..... *H10D 30/473* (2025.01); *H01L 21/02164* (2013.01); *H01L 21/049* (2013.01);
(Continued)

(58) Field of Classification Search
CPC .......... H01L 29/4236; H01L 29/66348; H01L 29/66734; H01L 29/7396; H01L 29/7397; H01L 29/7813; H01L 27/407; H01L 27/7813; H01L 27/66734; H10D 12/031; H10D 12/038; H10D 12/461; H10D 12/481; H10D 30/015; H10D 30/0291;
(Continued)

(56) References Cited

U.S. PATENT DOCUMENTS 5,233,215 A 8/1993 Baliga
5,742,076 A 4/1998 Sridevan et al.
(Continued)

FOREIGN PATENT DOCUMENTS

| | | | | |
|---|---|---|---|---|
| JP | 2008186925 A | 8/2008 | | |
| WO | 2005-065385 A2 | 7/2005 | | |
| WO | WO 2018/231866 | * 12/2018 | ........... | H01L 29/739 |

OTHER PUBLICATIONS

KIPO International Search Report for PCT/US2017/037050, mailed Oct. 20, 2017.
(Continued)

*Primary Examiner* — Mary A Wilczewski
(74) *Attorney, Agent, or Firm* — Patent Law Group; Brian Ogonowsky

(57) ABSTRACT

Heterostructure and double-heterostructure trench-gate devices, in which the substrate and/or the body are constructed of a narrower-bandgap semiconductor material than the uppermost portion of the drift region. Fabrication most preferably uses a process where gate dielectric anneal is performed after all other high-temperature steps have already been done.

16 Claims, 28 Drawing Sheets

Related U.S. Application Data

(60) Provisional application No. 62/518,486, filed on Jun. 12, 2017, provisional application No. 62/348,783, filed on Jun. 10, 2016.

(51) Int. Cl.

| | | |
|---|---|---|
| *H01L 21/04* | (2006.01) | |
| *H01L 21/265* | (2006.01) | |
| *H01L 21/28* | (2025.01) | |
| *H01L 21/285* | (2006.01) | |
| *H10D 12/00* | (2025.01) | |
| *H10D 12/01* | (2025.01) | |
| *H10D 30/01* | (2025.01) | |
| *H10D 30/47* | (2025.01) | |
| *H10D 30/66* | (2025.01) | |
| *H10D 62/10* | (2025.01) | |
| *H10D 62/13* | (2025.01) | |
| *H10D 62/17* | (2025.01) | |
| *H10D 62/82* | (2025.01) | |
| *H10D 62/822* | (2025.01) | |
| *H10D 62/832* | (2025.01) | |
| *H10D 62/85* | (2025.01) | |
| *H10D 64/00* | (2025.01) | |
| *H10D 64/27* | (2025.01) | |

(52) U.S. Cl.
CPC ...... *H01L 21/28185* (2013.01); *H01L 21/324* (2013.01); *H10D 12/031* (2025.01); *H10D 12/038* (2025.01); *H10D 12/461* (2025.01); *H10D 12/481* (2025.01); *H10D 30/015* (2025.01); *H10D 30/0291* (2025.01); *H10D 30/0295* (2025.01); *H10D 30/0297* (2025.01); *H10D 30/4732* (2025.01); *H10D 30/477* (2025.01); *H10D 30/668* (2025.01); *H10D 62/107* (2025.01); *H10D 62/136* (2025.01); *H10D 62/137* (2025.01); *H10D 62/154* (2025.01); *H10D 62/157* (2025.01); *H10D 62/158* (2025.01); *H10D 62/393* (2025.01); *H10D 62/82* (2025.01); *H10D 62/822* (2025.01); *H10D 62/8325* (2025.01); *H10D 62/8503* (2025.01); *H10D 64/112* (2025.01); *H10D 64/117* (2025.01); *H10D 64/513* (2025.01); *H01L 21/02274* (2013.01); *H01L 21/047* (2013.01); *H01L 21/26513* (2013.01); *H01L 21/28035* (2013.01); *H01L 21/28568* (2013.01)

(58) Field of Classification Search
CPC .......... H10D 30/0297; H10D 30/4732; H10D 30/477; H10D 30/668; H10D 62/136; H10D 62/393; H10D 62/82; H10D 62/822; H10D 62/8325; H10D 62/8503; H10D 64/112; H10D 64/117
See application file for complete search history.

(56) References Cited

U.S. PATENT DOCUMENTS

| | | | |
|---|---|---|---|
| 6,194,741 B1 | 2/2001 | Kinzer et al. | |
| 2007/0267672 A1 | 11/2007 | Hokomoto et al. | |
| 2009/0072241 A1* | 3/2009 | Harris | H01L 29/7813 257/77 |
| 2009/0194811 A1* | 8/2009 | Pan | H01L 29/165 257/330 |
| 2011/0095302 A1 | 4/2011 | Hikichi | |
| 2011/0254088 A1* | 10/2011 | Darwish | H01L 29/407 257/340 |
| 2011/0303925 A1* | 12/2011 | Nishimura | H01L 21/26586 257/77 |
| 2012/0032258 A1 | 2/2012 | Zeng et al. | |
| 2014/0027840 A1* | 1/2014 | Guan | H01L 29/407 257/330 |
| 2014/0141585 A1 | 5/2014 | Nakamura et al. | |
| 2014/0264564 A1 | 9/2014 | Cheng et al. | |
| 2016/0126346 A1 | 5/2016 | Hung et al. | |
| 2016/0149028 A1 | 5/2016 | Jin et al. | |
| 2016/0293743 A1 | 10/2016 | Darwish et al. | |
| 2018/0358449 A1* | 12/2018 | Zeng | H01L 29/66348 |
| 2018/0366569 A1* | 12/2018 | Zeng | H01L 29/66068 |

OTHER PUBLICATIONS

KIPO Written Opinion of the International Searching Authority for PCT/US2017/037050, mailed Oct. 20, 2017.
KIPO International Search Report for PCT/US2018/037154, mailed Oct. 5, 2018.
KIPO Written Opinion of the International Searching Authority for PCT/US2018/037154, mailed Oct. 5, 2018.
J.B. Casady et al. "Silicon Carbide Power MOSFET Technology", Compound Semiconductors 1997. Proceedings of the IEEE Twenty-Fourth International Symposium on Compound Semiconductors Year: 1997 pp. 359-362.

* cited by examiner

P+ Body Implant
High Temp Anneal with the carbon cap

N+ Source and P-Well Implant

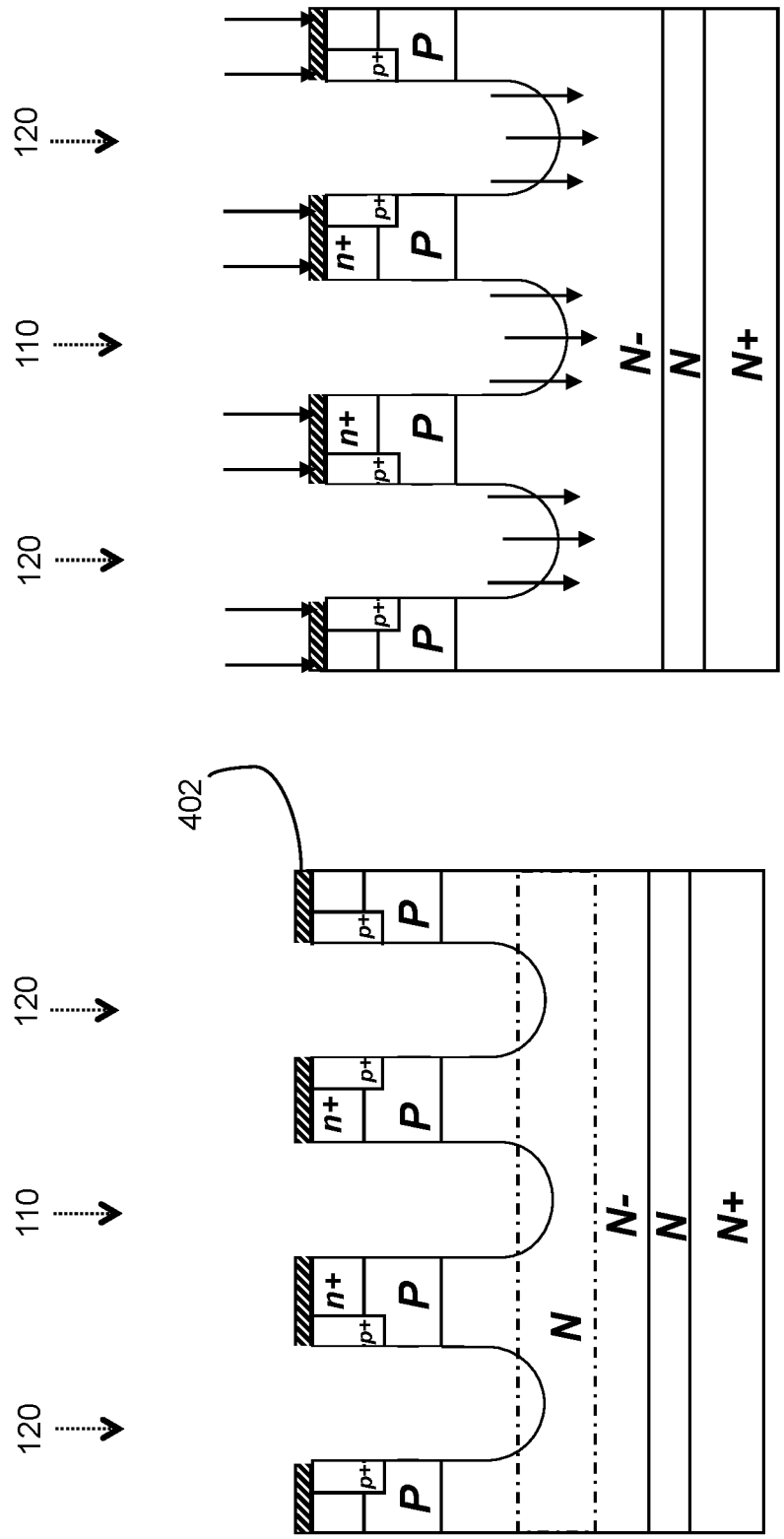

High Temp Anneal with carbon cap

P-Shield-Implant

BOX Photo and BOX Removal

Oxide Fill and Etch-back

PolySi Deposition and Etch-back

Gate Oxide

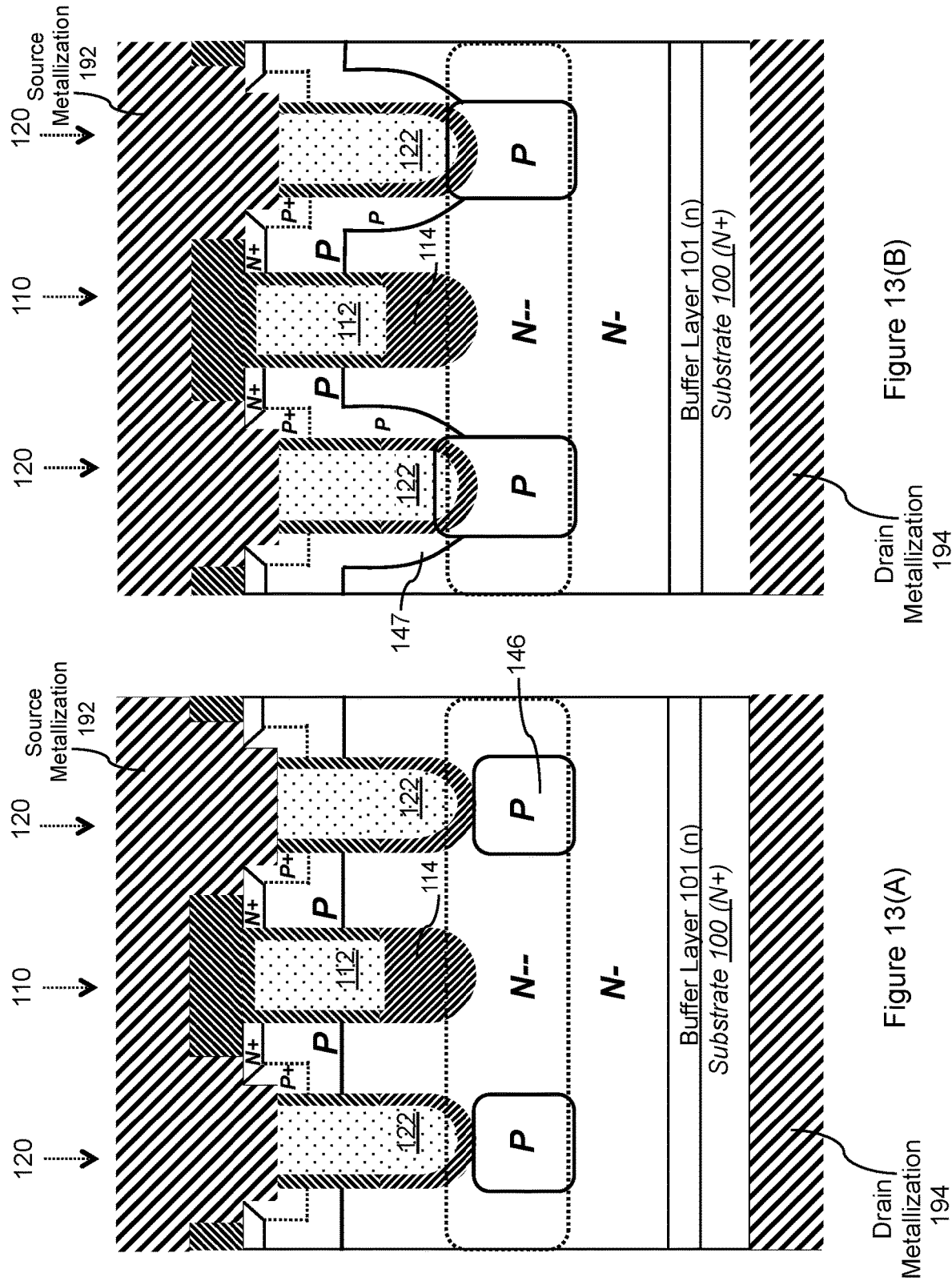

N+ Source and P-Well Implant

P+ Body Implant
High Temp Anneal with carbon cap

Alternative method to form modified doping region
N-Enhancement-Implant, or
N-Reduction-Implant Trench Etch High Temp Anneal with carbon cap
Gate Oxidation
PolySi Deposition and Etch-back P-Shield-Implant

TRENCH-GATED HETEROSTRUCTURE AND DOUBLE-HETEROSTRUCTURE ACTIVE DEVICES

CROSS-REFERENCE

Priority is claimed from U.S. 62/518,486. Priority is also claimed (in countries where this claim is permissible) from U.S. Ser. No. 15/620,547, and therethrough from U.S. 62/348,783. All of these applications are hereby incorporated by reference.

BACKGROUND

The present application relates to power semiconductor switching devices, and more particularly to trench-gate devices with predominantly vertical current flow in wide-bandgap semiconductor materials.

Note that the points discussed below may reflect the hindsight gained from the disclosed inventions, and are not necessarily admitted to be prior art.

Silicon carbide ("SiC") power MOSFETs suffer from low channel mobility, which results in a higher on-state resistance due to high channel resistance. In order to improve this problem, one of the most efficient techniques is to increase the channel density by employing a trench gate structure. However, the trench gate structure suffers a high electric field at the trench bottom corner due to the curvature of its geometry and the oxide thinning at the trench bottom and corner. In SiC trench gated devices this problem is worse than in a comparable silicon device because (for a given breakdown voltage rating) a higher epitaxial doping concentration is used in the SiC device; the higher epitaxial doping concentration results in a high bulk electric field in SiC drift region. Moreover, the high bulk field also leads to a higher electric field inside the gate oxide at the trench corner area when compared to the situation in Si device. As consequence, the gate oxide layer becomes much easier to breakdown at the trench bottom in SiC trench-gated device during off-state blocking operation. Additionally, the hot carrier injection becomes much severer. This is one of the most critical issues needed to be addressed in order to produce a reliable trench-gated SiC device.

Trench-Gated Heterostructure and Double-Heterostructure Active Devices

The present application teaches, among other innovations, heterostructure and double-heterostructure trench-gate devices, in which the substrate and/or the body are constructed of a narrower-bandgap semiconductor material than the uppermost portion of the drift region. Fabrication most preferably uses a process where gate dielectric anneal is performed after all other high-temperature steps have already been done.

The present application also discloses a fabrication process for manufacturing trench-gated power insulated-gate field-effect transistors to achieve doping modifications below at least some non-gate trenches. The non-gate trenches are preferably and advantageously, but not necessarily, field plate trenches. The disclosed process is especially advantageous with silicon carbide semiconductor materials.

The present application teaches that doping modifications below non-gate trenches can be used to improve the tradeoff between conductivity and breakdown voltage as well as the electric field in wide-bandgap field-effect transistors.

One inventive point is that the doping modification below the non-gate trenches is introduced in a self-aligned manner and activated before the gate oxide is grown on the gate trenches. Most preferably the gate dielectric growth is performed after all high temperature processes are finished; however, metal sputtering is used to form metal connections, and a transient annealing step ("RTA", or rapid thermal anneal) is optionally used for silicidation of front and back metallization (preferably simultaneously).

Another inventive point is that the doping modification can be chosen to provide merely a reduction in the doping below the non-gate trench. This reduces the peak field value below both the non-gate trenches and the gate trench, without significantly degrading the conductivity of the device.

BRIEF DESCRIPTION OF THE DRAWINGS

The disclosed inventions will be described with reference to the accompanying drawings, which show important sample embodiments and which are incorporated in the specification hereof by reference, wherein:

FIGS. 2-11 show a sequence of process steps which result in fabrication of a completed transistor structure like that of FIG. 12(a) or FIG. 13(a).

FIG. 13(b) shows a transistor structure which is generally similar to that of FIG. 13(a), except that a tilted implant was used to produce shield extension regions.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application discloses new device structures, and processes for making them, as applied to vertical-current-flow insulated-gate active devices in wide-bandgap semiconductor materials.

Silicon carbide ("SiC") power MOSFETs suffer from low channel mobility, which results in a higher on-state resistance due to high channel resistance. In order to improve this problem, one of the most efficient techniques is to increase the channel density by employing a trench gate structure. However, the trench gate structure suffers a high electric field at the trench bottom corner due to the curvature of its geometry and the oxide thinning at the trench bottom and corner. In SiC trench gated devices this problem is worse than in a comparable silicon device because (for a given breakdown voltage rating) a higher epitaxial doping concentration is used in the SiC device; the higher epitaxial doping concentration results in a high bulk electric field in SiC drift region. Moreover, the high bulk field also leads to a higher electric field inside the gate oxide at the trench corner area when compared to the situation in Si device. As consequence, the gate oxide layer becomes much easier to breakdown at the trench bottom in SiC trench-gated device during off-state blocking operation. Additionally, the hot carrier injection becomes much severer. This is one of the most critical issues needed to be addressed in order to produce a reliable trench-gated SiC device.

Fortunately, this weakness can be significantly improved by the new device structure described in U.S. Pat. No. 8,076,719. The new device has P-type shield region underneath the field plate trench to reduce the electric field at the trench bottom and corners. It also has a thick oxide layer at the trench bottom which greatly reduces the electric field of oxide inside the trench. Therefore, this new device structure can be directly used to resolve the problem mentioned above. However, the fabrication process disclosed in U.S. Pat. No. 8,076,719 has several drawbacks for fabrication of the new device using the SiC material. This is because, in order to avoid the Si sublimation and the surface step bunching formation as well as the carbon cluster development in the SiC/Oxide interface, it is desired to grow the gate oxide after all high temperature anneal/activation process steps completed.

The present application discloses a fabrication process for manufacturing SiC material based trench-gated power MOSFET with doping modifications below non-gate trenches, e.g. like those disclosed in U.S. Pat. No. 8,076,719.

Figure 1:
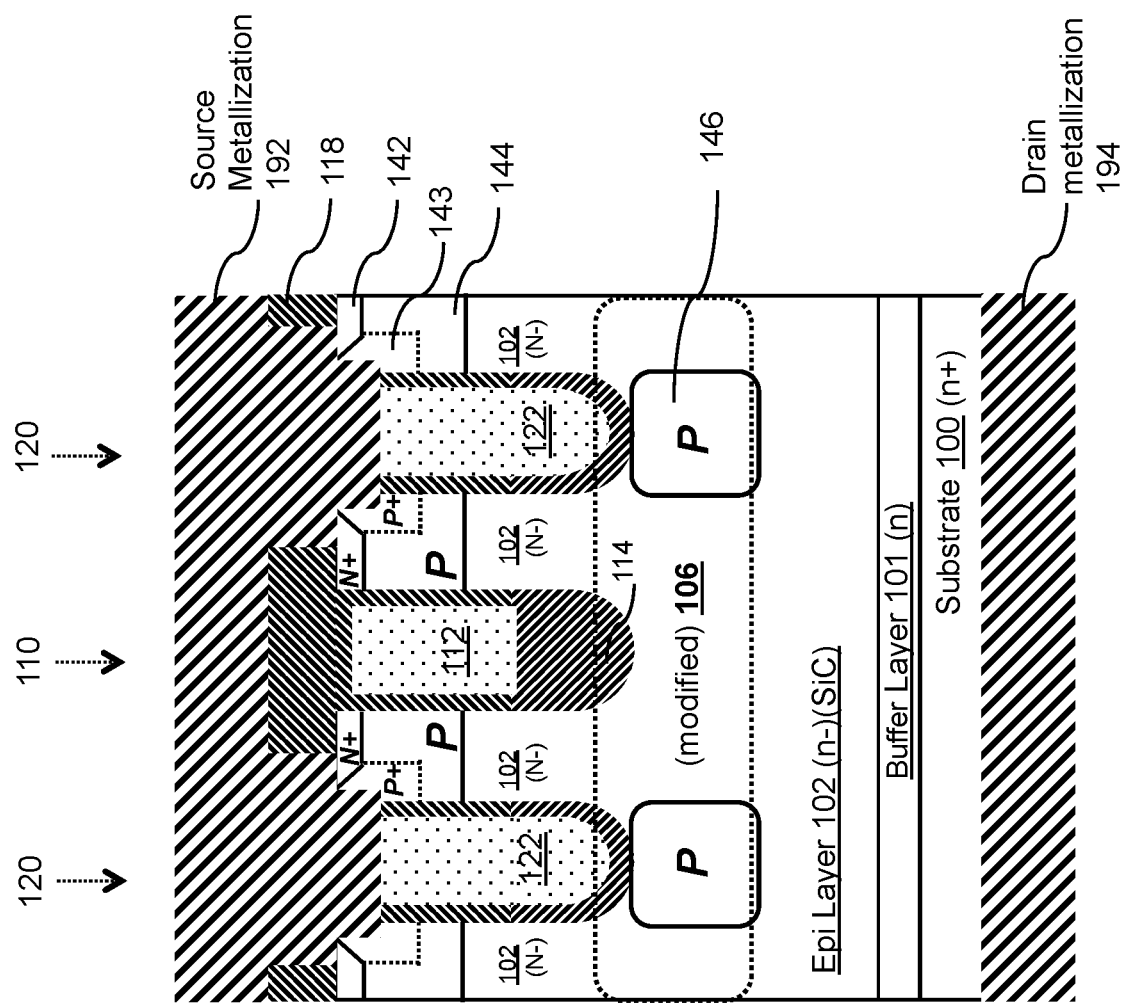
FIG. 1 schematically shows a trench-gate transistor which permits controllable vertical current flow through a silicon carbide semiconductor die.

FIG. 1 shows a trench-gate transistor which permits controllable vertical current flow, e.g. from front to back of a device die. Front-side current-carrying metallization 192 connects to n+ source region 142, and also to a p+ body contact region 143 (which connects to p-type body 144). An interlevel dielectric 118 provides electrical insulation of the metallization from the gate electrode 112.

Back-side current-carrying metallization 194 connects to n+ substrate 100, which acts as the drain contact.

This example is an n-channel (NMOS) device. (P-channel devices can be constructed on similar principles.) In operation, assuming that the drain terminal 194 is connected to a positive voltage (e.g. 1000V, with the source terminal 192 connected to ground): when the gate electrode 122 is raised to a sufficiently positive voltage, it will invert the nearest part of the body region 144 to form a channel. Once the channel has formed, the flow of electrons is no longer blocked by a reverse-biased source junction, so electrons (which are the majority carriers) will flow out of the source, through the channel (bypassing the uninverted portions of the body), and into the drift region (provided, in this example, by the uppermost parts of the n– epitaxial layer 102). The drift region, as illustrated, includes a region 106 where the body doping has been modified; the function of this region will be discussed further below.

The gate voltage at which the channel forms is referred to as the "threshold" voltage. This may be e.g. 1V-6V, but the exact value of the threshold voltage will depend on body doping, channel doping, oxide fixed charge if any, work function differences, etc.

In this example, the gate trench 110 includes a buried oxide layer 114 below the gate electrode 112. The non-gate trenches 120 include recessed field plates 122, which are typically tied to the source potential.

Table 1 shows an overview of a process flow for producing a device like that shown in FIG. 1.

TABLE 1

| Process Flow with BOX Layer |
|---|
| Wafer Start |
| PECVD Oxide |
| Optional N-Enhancement Photo and Hardmask formation |
| Optional N-Enhancement Implant |
| N+ Source Photo |
| N+ Source Implant |
| P-Well Photo and Hardmask formation |
| P-Well Implant |
| P+ Body Photo and Hardmask formation |
| P+ Body Implant |
| PECVD Oxide Removal |
| Anneal w/the carbon caps layer |
| Hard Mask (USG) |
| Trench Photo |
| Trench Hard Mask Etch |
| Trench Etch |
| Trench-reflow |
| Alternative (optional) N-Enhancement Implant. |
| P-Shield Photo |
| P-Shield-Implant |
| Anneal w/the carbon caps layer |
| Sacrificial Oxidation (SAC) |
| SAC Oxide Removal |
| High Quality Oxide Fill (HDP) |
| USG ReFill (PECVD) |
| CMP |
| Active Etch |
| Trench Bottom Oxide (BOX) |
| BOX Photo |
| BOX Remove |
| Gate Oxidation |
| PolySi Deposition |
| PolySi Activation/Anneal |
| PolySi |
| ILD CVD |

TABLE 1-continued

Process Flow with BOX Layer

Figure 2:
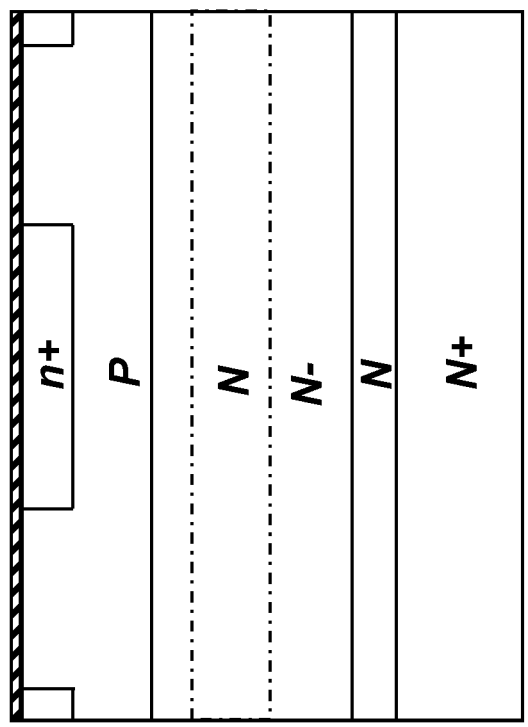

Contact Photo
Plug Etch
Ni/TiN/Ti Sputtering on both front and backside
Silicidation by RTA
Frontside Metal (M1) Sputtering
M1 Photo
M1 Etch
Passivation
PAD Photo
PAD Open In more detail, the sequence of operations includes: Starting with SiC N+ substrate 100, the N-buffer layer 101 and N− epitaxial layer 102 are grown. (It is important to note that the SiC starting material can also be grown on a Silicon substrate, as shown below, in order to reduce cost.) A masked implant is optionally performed to modify the doping concentration of N− epitaxial layer 102, and thereby form the modified doping region 106. Most preferably this implant is of a donor dopant (such as $P^{31}$ or $N_2$). As shown in FIG. 2, this is followed by a masked implant (using an acceptor dopant, e.g. Al or B) which forms the p-type body region 144. This is performed by implants with multiple dosages and energy; the dosages are in the range from 5E12 (i.e. $5\times10^{12}$) to $5E13/cm^2$, and the energy is between 100 keV and 1 MeV.

The ambient temperature can be room temperature or a moderate higher temperature, such as 400° C.-700° C. (This doping value will affect the threshold voltage, as will the channel doping introduced later in the process.)

An N+ implant (using a donor dopant, e.g. such as P or $N_2$) is now performed in the locations where the n+ source regions 142 will be located.

These steps are preferably followed by a p-type implant (using an acceptor dopant, such as Al or B), to form the P-body contact region 143. This is followed by a high temperature furnace anneal process (>1600° C.) in Ar ambient with a carbon cap layer 302 for protection. This high-temperature step activates the N+ and P+ implants, and will slightly shift the profile of the source region 142.

Figure 3:
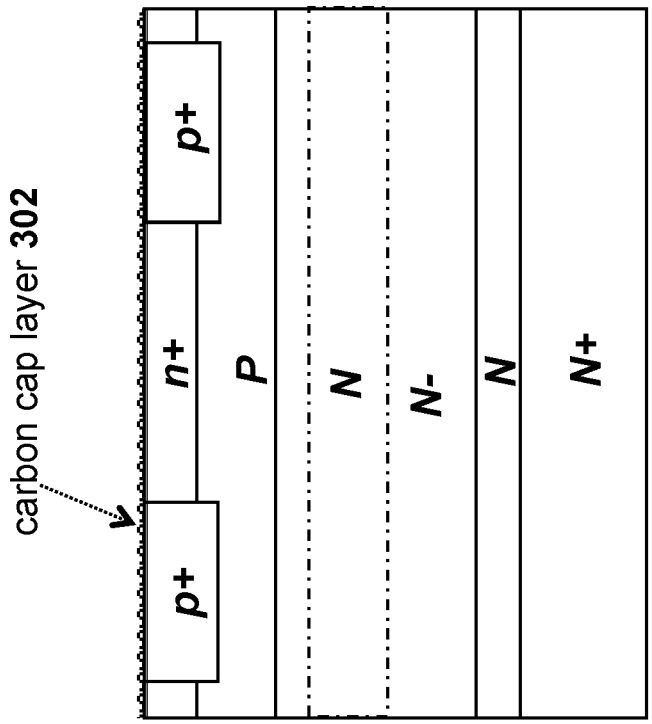

The N+ and P+ implants are preferably done at an elevated temperature (such as 600° C.). This results in the structure shown in FIG. 3.

With a hard mask 402 (such as oxide), a SiC etch is now carried out to form the gate trenches 110 and non-gate trenches 120. (These trenches are preferably identical at this point, but will be differentiated by later steps.) This produces the structure shown in FIG. 4.

Another alternative to form the optional modified doping region 106 is by using a blanket implant to locally modify the doping concentration of N− epitaxial layer 102. Most preferably this is of a donor dopant (such as $P^{31}$ or $N_2$), in which case the modified doping region 106 has heavier doping, and hence higher conductivity, than the rest of the N− epitaxial layer 102. Alternatively, as discussed below, the blanket implant can use an acceptor dopant, such as Al or B, to locally decrease the doping concentration of N− epitaxial layer 102. This provides some reduction in the peak field value near the bottom corners of the trenches, and hence can provide some additional protection against hot carrier injection. This can be advantageous in high-voltage and/or rad-hard applications. This results in the structure of FIG. 5.

Figure 6:
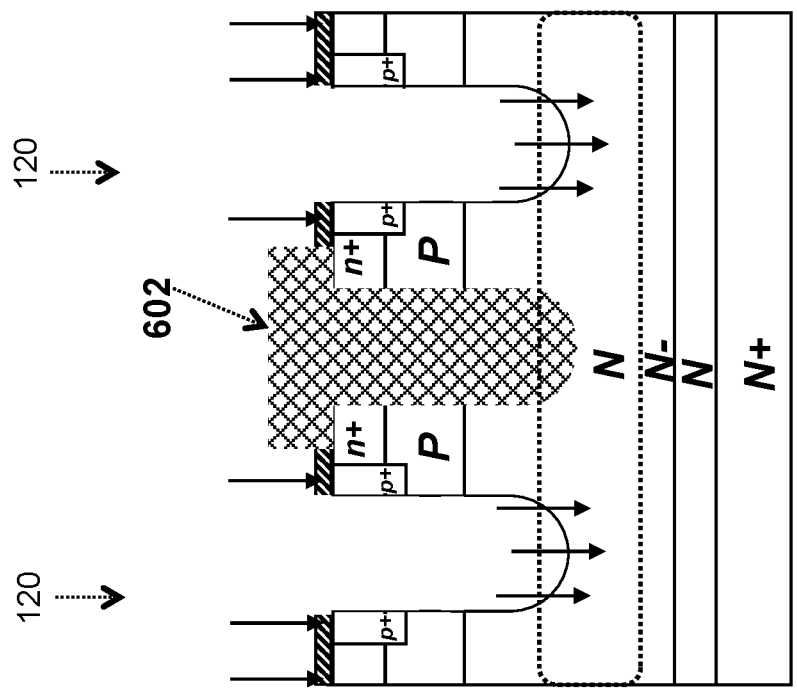

Next, patterned resist 602 is used to protect the active gate trench 110, and then acceptor dopant (such as Al or B) is implanted into N/N− epitaxial layer 102 through the field plate trench 120, as shown in FIG. 6. This implant will form the P-Shield region 146 underneath the trenches 120. The implantation can be adjusted properly to optimize the P-Shield profile along the field plate trench sidewall and the depth of P-Shield.

Figure 7:
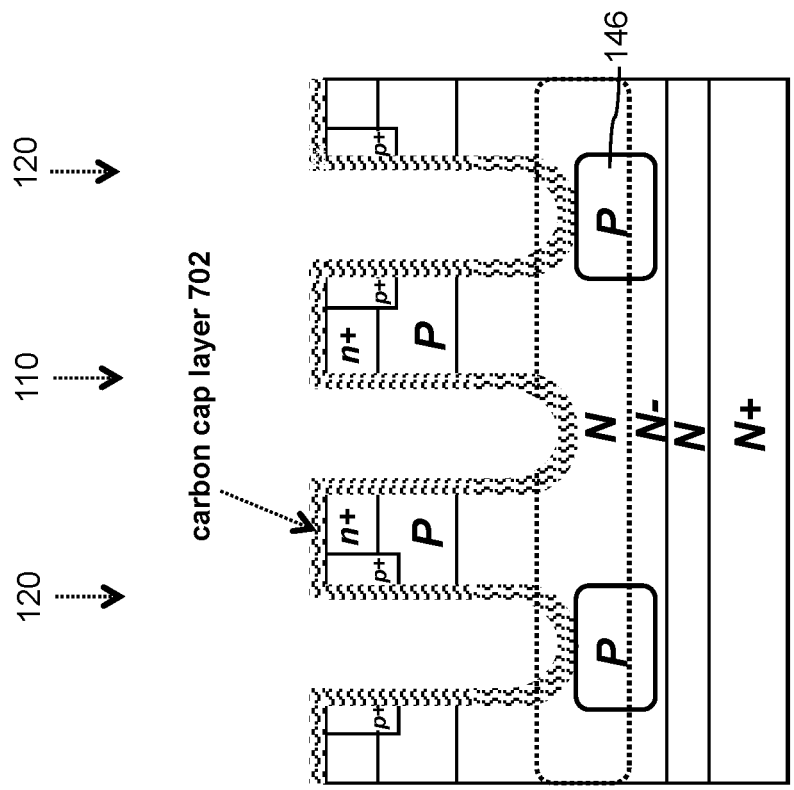

After complete removal of the BOX photo resist 602 and surface oxide layers, a high temperature process (>1600° C.) in Ar ambient is carried out to anneal and activate all of implanted dopants with a carbon cap layer 702 in place for protection. This is depicted in FIG. 7.

Figure 8:
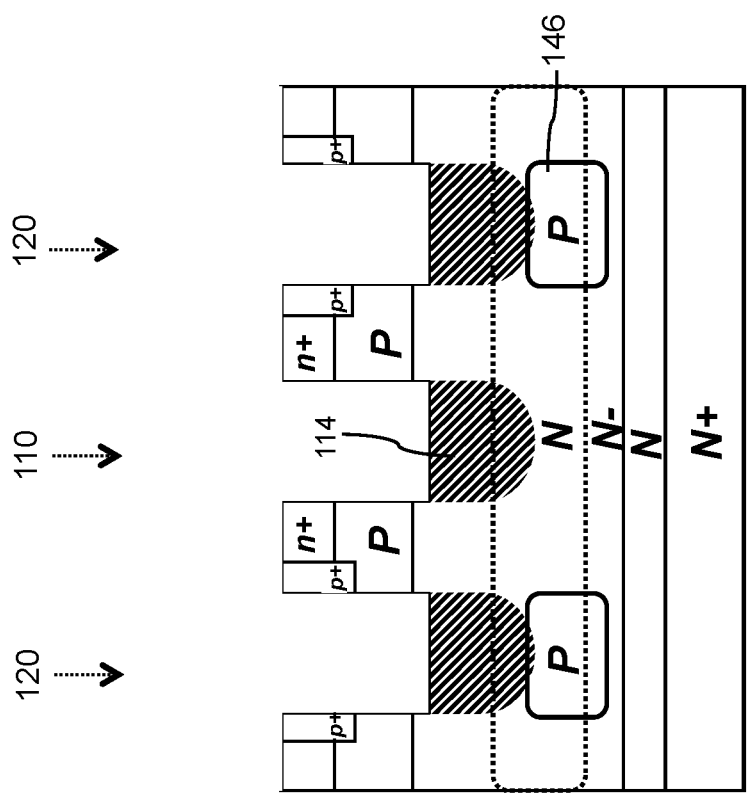

Next all the trenches (110 and 120) are filled up with high density oxide. The oxide etch back process is then applied to create the trench thick bottom oxide layer (BOX) 114 as shown in FIG. 8.

Figure 9:
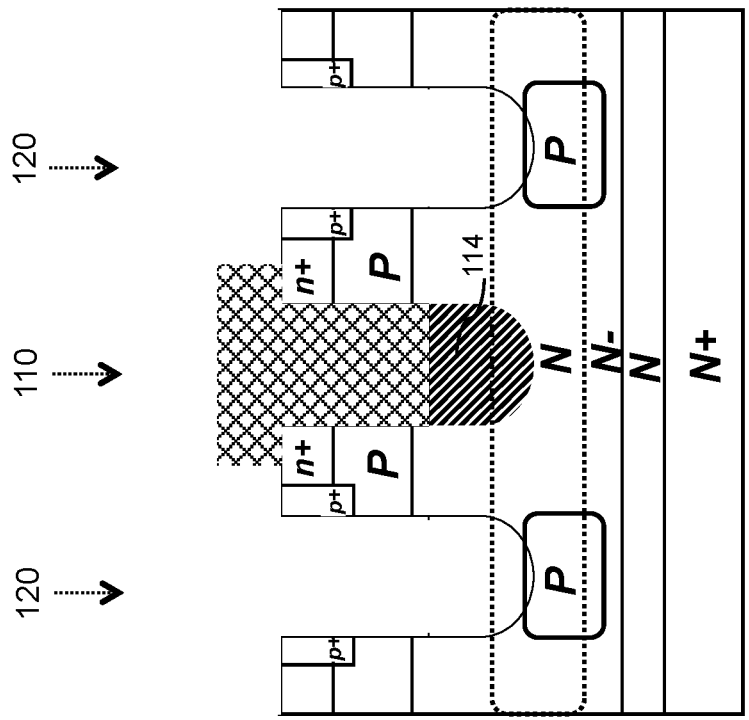

Next, the BOX photo resist 602 is formed again to protect the active gate trench 110, and the oxide inside the field plate trench is completely etched. This leaves a BOX oxide 114 in place in the gate trenches 110, but not in the non-gate trenches 120, as shown in FIG. 9.

At this point, all of high temperature processes are finished. ("High Temperature" process steps, in SiC device fabrication, would generally be considered to be those using a temperature of more than 1200° C.—especially those where heating is not transient.) No more high temperature process steps follow the process of gate formation.

Figure 10:
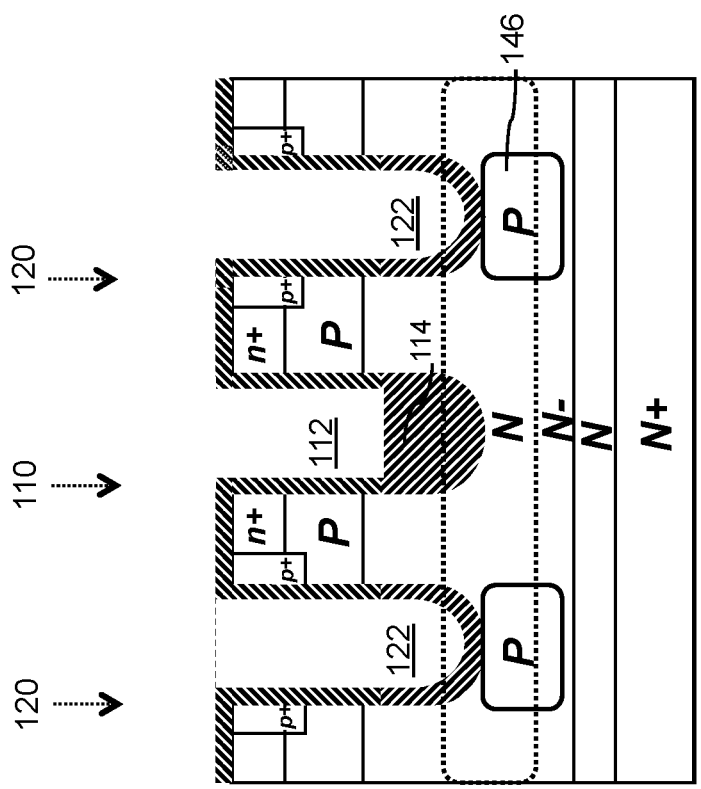

Now, the gate formation process begins. Initially a sacrificial oxide is preferably grown and stripped. The gate oxide layer itself is preferably formed by dry thermal oxidation (or alternatively by a CVD process) along the trench sidewall as illustrated by FIG. 10. The gate oxide thickness is preferably between 400 Å (40 nm) to 600 Å, and typically 500 Å.

Gate oxide formation is most preferably done in two steps: first, a layer of stoichiometric oxide is formed by CVD deposition or high temperature oxidation, in temperature range between 1100° C. to 1300° C.; secondly, a relatively high temperature anneal is performed in an oxidizing nitrogen-rich ambient (e.g. with 100% $N_2O$ or NO). The anneal temperature, in this example, is between 1100° C. to 1350° C. No high-temperature process steps should follow the gate oxide anneal.

Depending on the nitrogen concentration during the culminating anneal, the gate oxide can be partially converted to an oxynitride compound. The net activity of nitrogen is increased by using an oxygen-nitrogen compound as the oxidizing component in the gas phase, and can be further increased by addition of $N_2$ or other nitrogen source.

This culminating gate oxide anneal maximizes the quality of the semiconductor-to-oxide interface. Surprisingly, this culminating anneal also provides improvement in the radiation-hardness of the final device.

Figure 11:
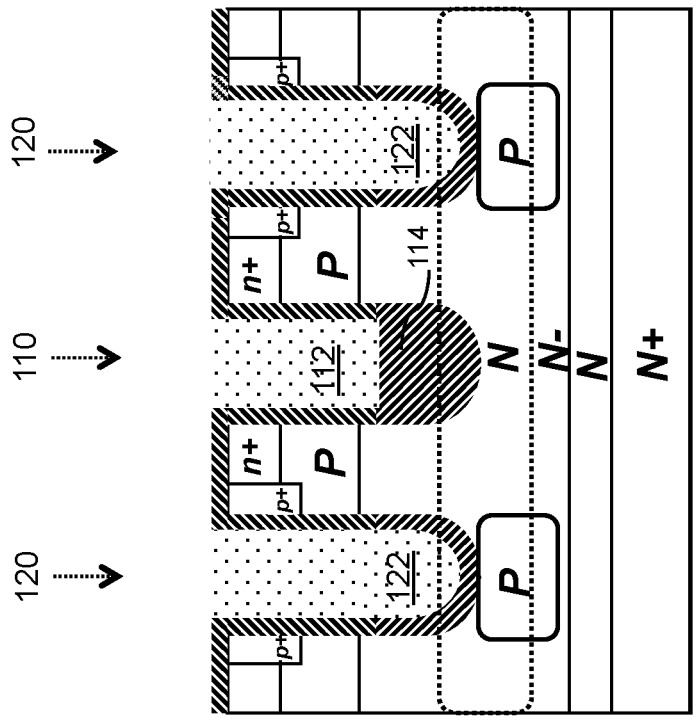

The gate electrode 112 and field plate 122 are now formed, e.g. by deposition and CMP of n+ polysilicon. This results in the structure of FIG. 11.

Interlevel dielectric 118 is now formed, e.g. by CVD, and etched back to expose the non-gate trenches 120. A recess etch is now performed to expose the n+ source and p+ body contact regions to the source metallization.

From this point on the rest of process steps are generally similar to those described in prior art U.S. Pat. No. 8,076, 719, with exception that the front and backside contact metal layer are formed at the same time (e.g. by sputter deposition of a nickel/Titanium Nitride/titanium stack, followed by RTA silicidation).

This is done in order to achieve good ohmic contact to both N+ Source (front side) and N+ Drain (backside) regions. The typical RTA is carried out at 950° C. in Ar ambient.

A thick metal layer 192, such as Aluminum, is now deposited on the front side of the device to form the Source electrode. Another thick metal layer 194 similarly forms the Drain electrode. Electrical connection to the gate electrode 112 is formed similarly, but outside the area illustrated.

Figure 12B:
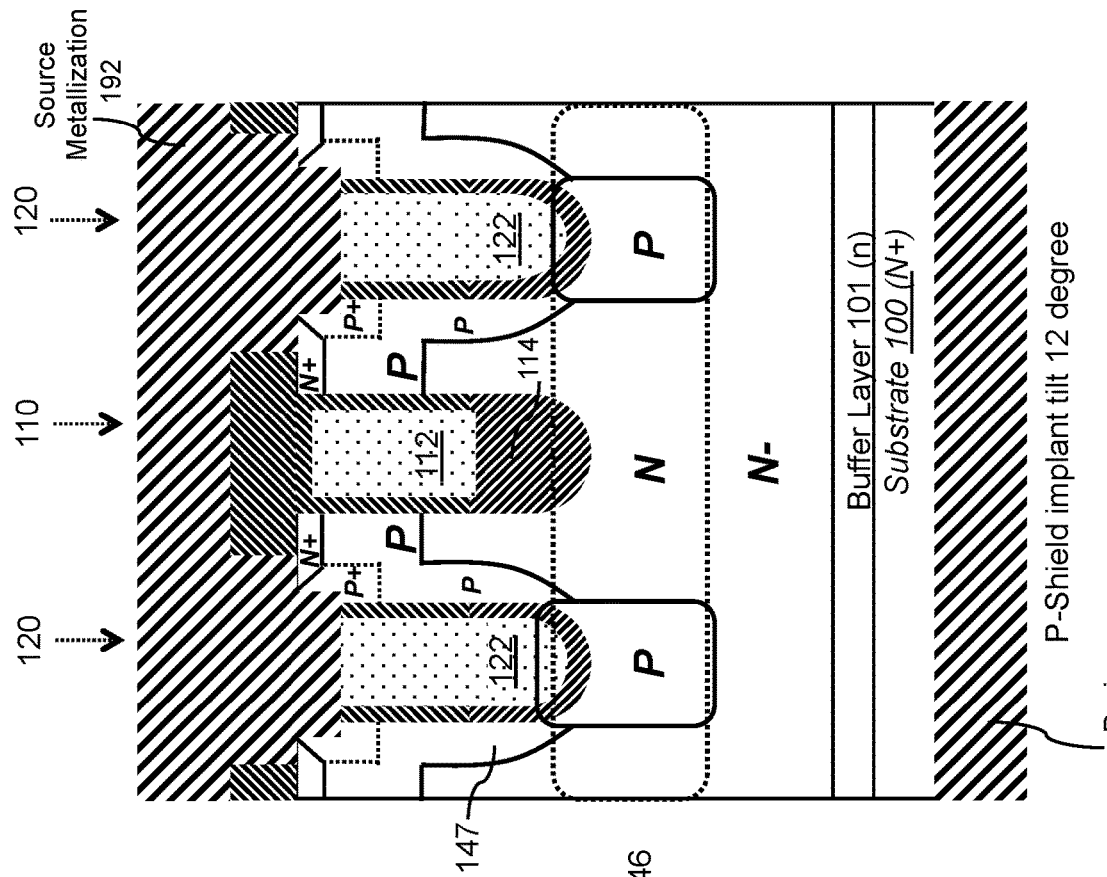
FIG. 12(b) shows a transistor structure which is generally similar to that of FIG. 12(a), except that a tilted implant was used to produce shield extension regions.
Figure 12A:
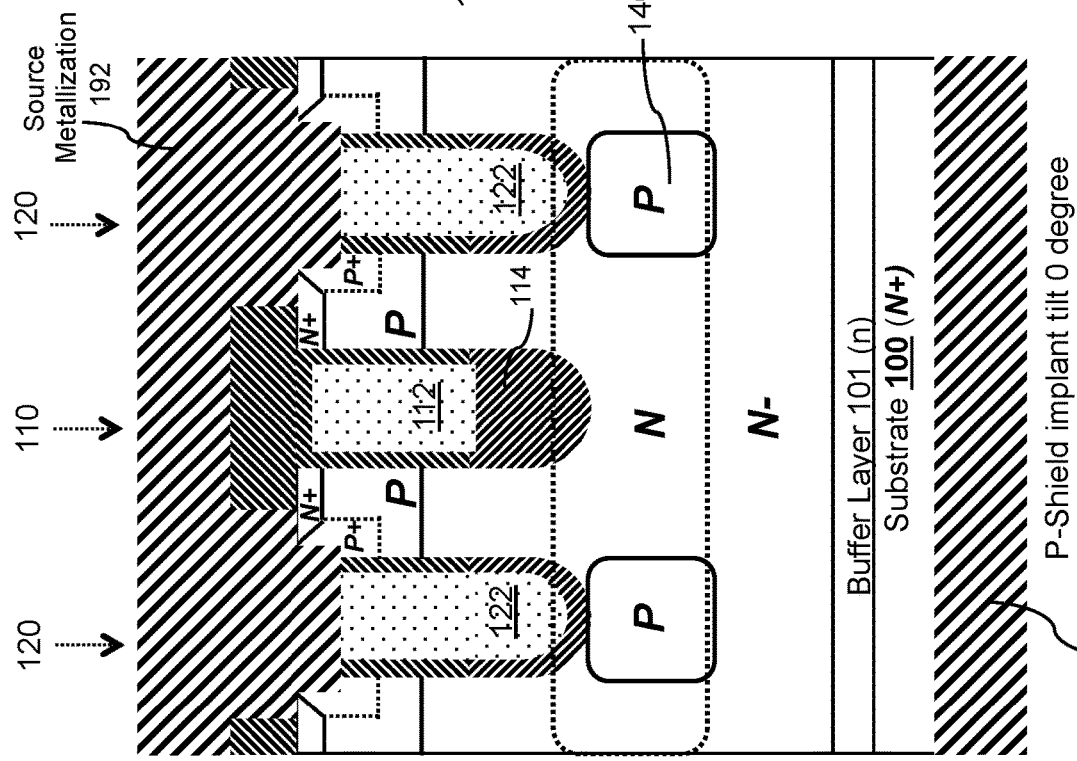

FIGS. 12(*a*) through 13(*b*) show a variety of final device structures produced by the above steps. In FIG. 13(*a*) and FIG. 13(*b*) the modified-doping region 106 is an "N-reduced" region, resulting from the implantation of acceptors as an N-reduction implant at the stage of FIG. 5. By contrast, FIG. 12(*a*) and FIG. 12(*b*) show examples where donors were blanket-implanted to make region 106 an "N-enhanced" region. The "N-reduced" region can be utilized to further lessen the electric field at the trench bottom and corners. The "N-enhanced" region can be used to reduce the device on-resistance and enhance forward current conduction.

Another option is use of a tilted implant at the stage of FIG. 6. In this case the location of the P-shield 146 is expanded to include additional p-shield-extension regions 147 around the sides of the non-gate trenches 122. Thus, depending on the implant angle of P-Shield dopant, the P body can either be connected to the P-Shield zone or disconnected from the P-Shield zone. Examples of this are shown in FIG. 12(*b*) and FIG. 13(*b*).

FIG. 12(*a*) and FIG. 13(*a*), by contrast, show examples where the P-Shield implant was not tilted (0 degrees tilt angle).

The dopings and thicknesses will depend on what operating voltage a device is designed for. For example, when the above device is optimized for 1200V operation, the epitaxial layer thickness is expected to be about 11 μm, and its doping is expected to be about $6E15/cm^3$. For a 650V implementation, the epitaxial layer thickness is expected to be about 5 μm and its doping is about $1E16/cm^3$. The P-body junction depth is preferably about 0.8 μm and the trench depth is about 1 μm. The shield region 146 is about 0.5 μm to 1 μm thick, so the thickness of the epitaxial layer below the shield is expected to be about 9 μm for 1200V device, and about 3 μm for 650V device.

Figure 14A:
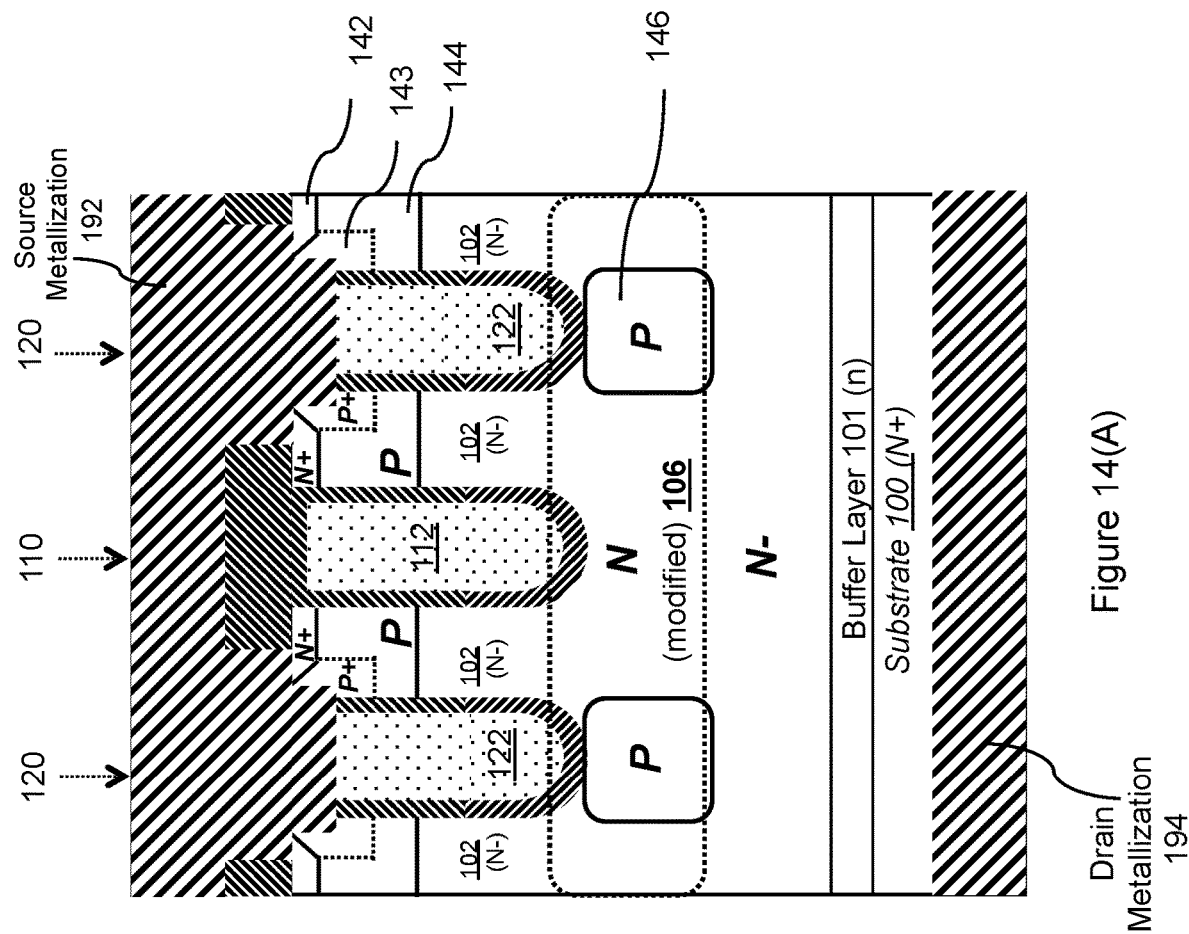
FIGS. 14(a) and 14(b) show a transistor structure which is generally somewhat similar to that of FIG. 12(a), except that no bottom oxide is present in the gate trench. Note that FIGS. 14(a) and 14(b) use different formation methods for modified doping regions 106 and 1061.
Figure 14B:
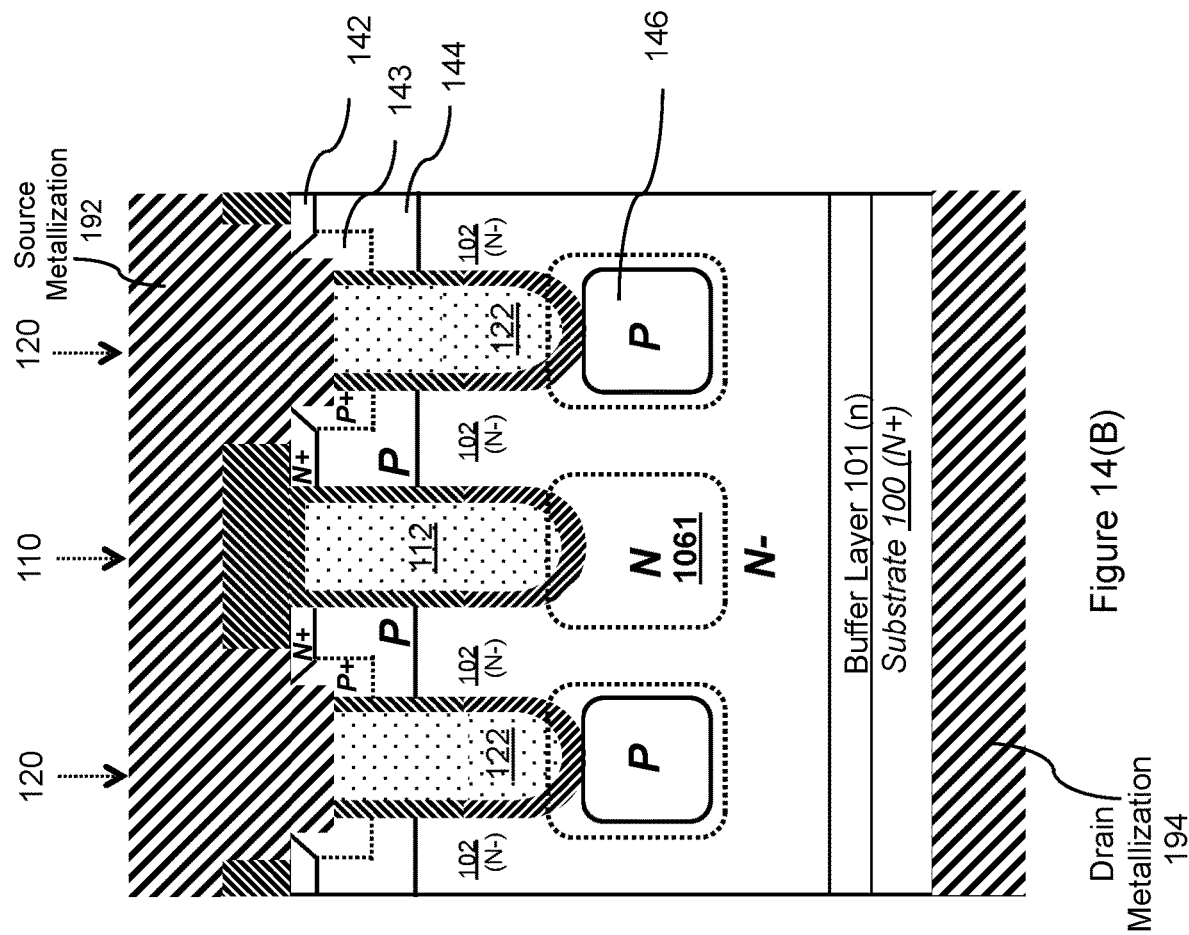

Table 2 summarizes the process flow for producing the device shown in FIG. 14(*a*) or 14(*b*), in which the thick bottom oxide BOX is eliminated. Its process flow is similar to, but simpler than, the process sequence described in the previous paragraphs.

TABLE 2

| Process Flow without BOX Layer |
| --- |
| Wafer Start |
| PECVD Oxide |
| Optional N-Enhancement Photo an Hardmask formation |
| Optional N-Enhancement Implant |
| N+ Source Photo and Hardmask formation |
| N+ Source Implant |
| P-Well Photo |
| P-Well Implant |
| P+ Body Photo and Hardmask formation |
| P+ Body Implant |
| PECVD Oxide Removal |
| Anneal w/the carbon caps layer |
| Hard Mask (USG) |
| Trench Photo |
| Trench Hard Mask Etch |

TABLE 2-continued

| Process Flow without BOX Layer |
| --- |
| Trench Etch |
| Trench-reflow |
| Alternative (optional) N-Enhancement Implant. |
| P-Shield Photo |
| P-Shield-Implant |
| Anneal w/the carbon caps layer |
| Sacrificial Oxidation (SAC) |
| SAC Oxide Removal |
| Gate Oxidation |
| PolySi Deposition |
| PolySi Activation/Anneal |
| PolySi/TiW Etch-back |
| ILD CVD |
| Contact Photo |
| Plug Etch |
| Ni/TiN/Ti Sputtering on both front and backside |
| Silicidation by RTA |
| Frontside Metal (M1) Sputtering |
| M1 Photo |
| M1 Etch |
| Passivation |
| PAD Photo |
| PAD Open |

Figure 15:
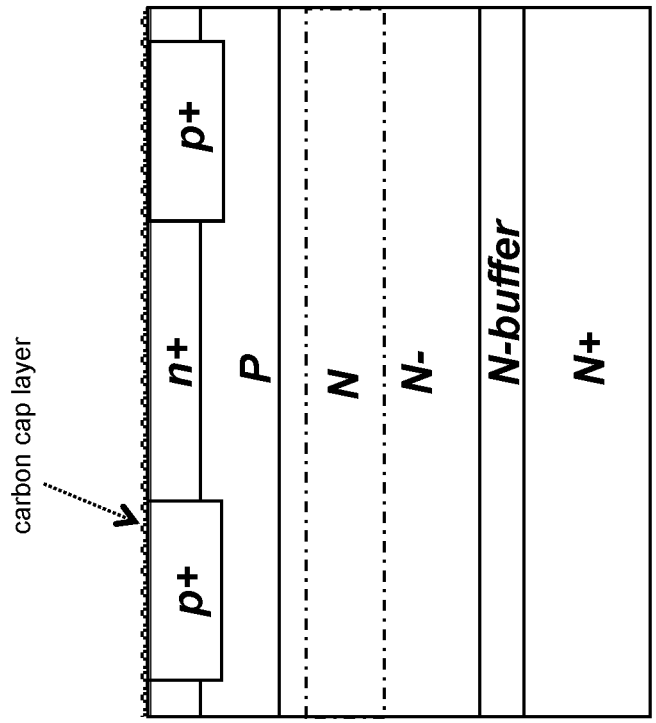
FIGS. 15-20 show a sequence of process steps which result in fabrication of a completed transistor structure like that of FIG. 21(a) or FIG. 21(b) or FIG. 22. Note that FIGS. 21(a) and 21(b) use different formation methods for modified doping regions 106 and 1061.
Figure 16:
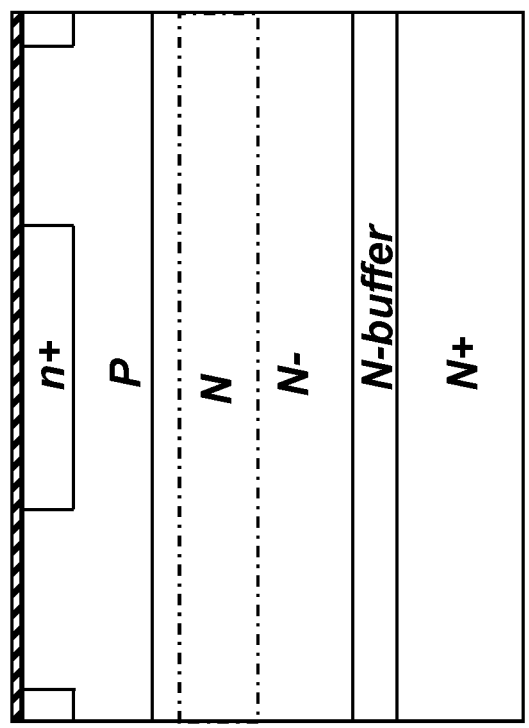
Figure 18:
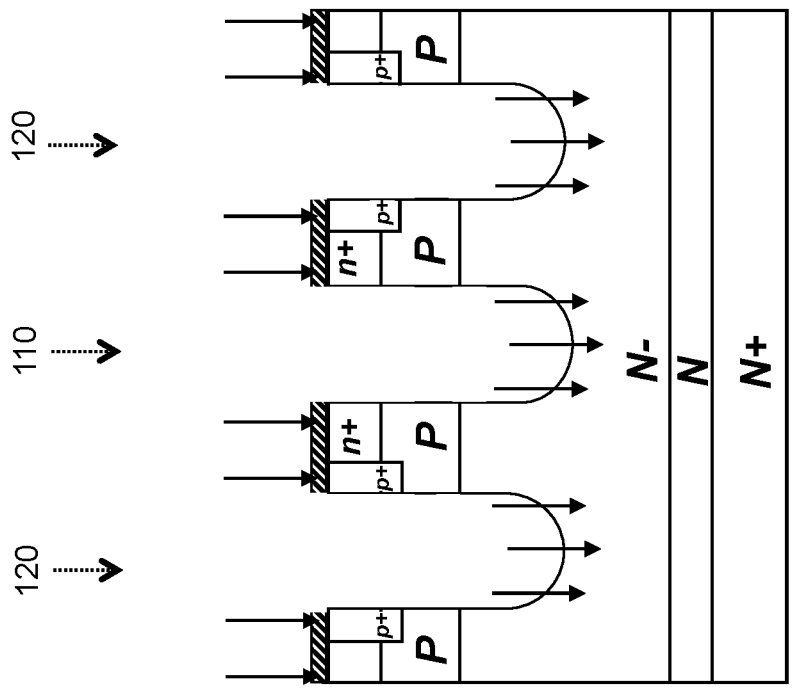
Figure 17:
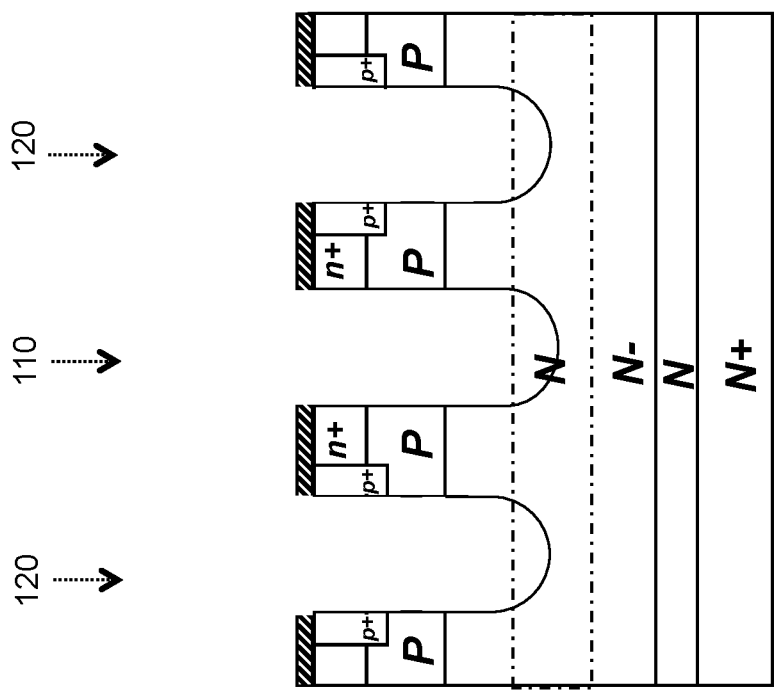

This process is illustrated in FIGS. 15-22. Starting with SiC N+ substrate 100, the N-buffer layer 101 and N– epitaxial layer 102 are grown. As shown in FIG. 15, this is followed by a masked implant (using an acceptor dopant, e.g. Al or B) which forms the p-type body region 144.

An N+ implant (using a donor dopant, e.g. such as P or $N_2$) is now performed in the locations where the n+ source regions 142 will be.

These steps are preferably followed by p-type implants (using an acceptor dopant, such as Al or B), to form the P-body contact region 143. This is followed by a high temperature furnace anneal process (>1600° C.) in Ar ambient with a carbon cap layer 302 for protection. This high-temperature step activates the N+ and P+ implants, and will slightly shift the profile of the source region 142.

The N+ and P+ implants are preferably done at an elevated temperature (such as 600° C.). This results in the structure shown in FIG. 16.

With a hard mask 402 (such as oxide), a SiC etch is now carried out to form the gate trenches 110 and non-gate trenches 120. (This trenches are preferably identical at this point, but will be differentiated by later steps.) This produces the structure shown in FIG. 17.

A blanket implant is now performed to locally modify the doping concentration of N– epitaxial layer 102, and thereby form the modified doping region 106. Most preferably this is of a donor dopant (such as $P^{31}$ or $N_2$), in which case the modified doping region 106 has heavier doping, and hence higher conductivity, than the rest of the N– epitaxial layer 102. Alternatively, as discussed below, the blanket implant can use an acceptor dopant, such as Al or B, to locally decrease the doping concentration of N– epitaxial layer 102. This provides some reduction in the peak field value near the bottom corners of the trenches, and hence can provide some additional protection against hot carrier injection. This can be advantageous in high-voltage and/or rad-hard applications. This results in the structure of FIG. 18.

Figure 19:
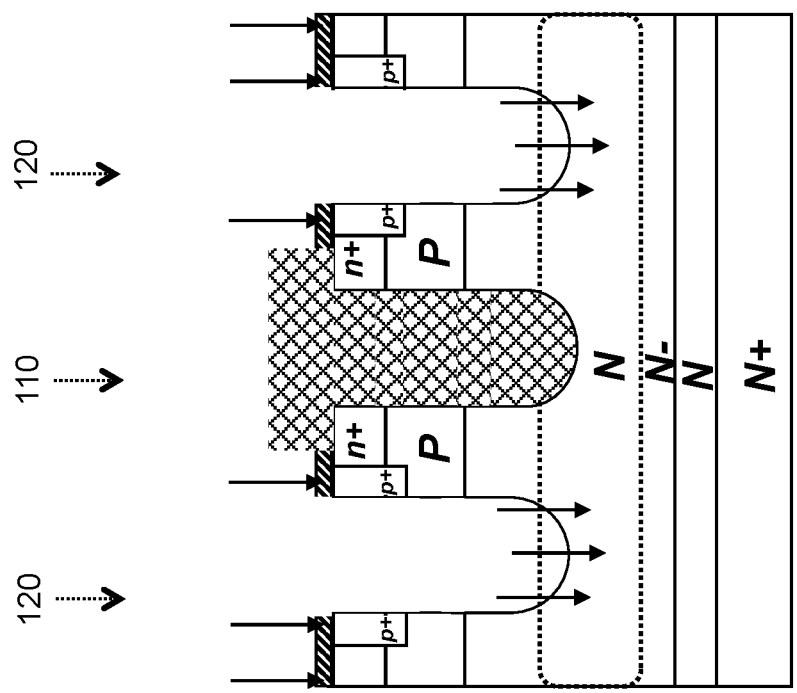
Figure 21A:
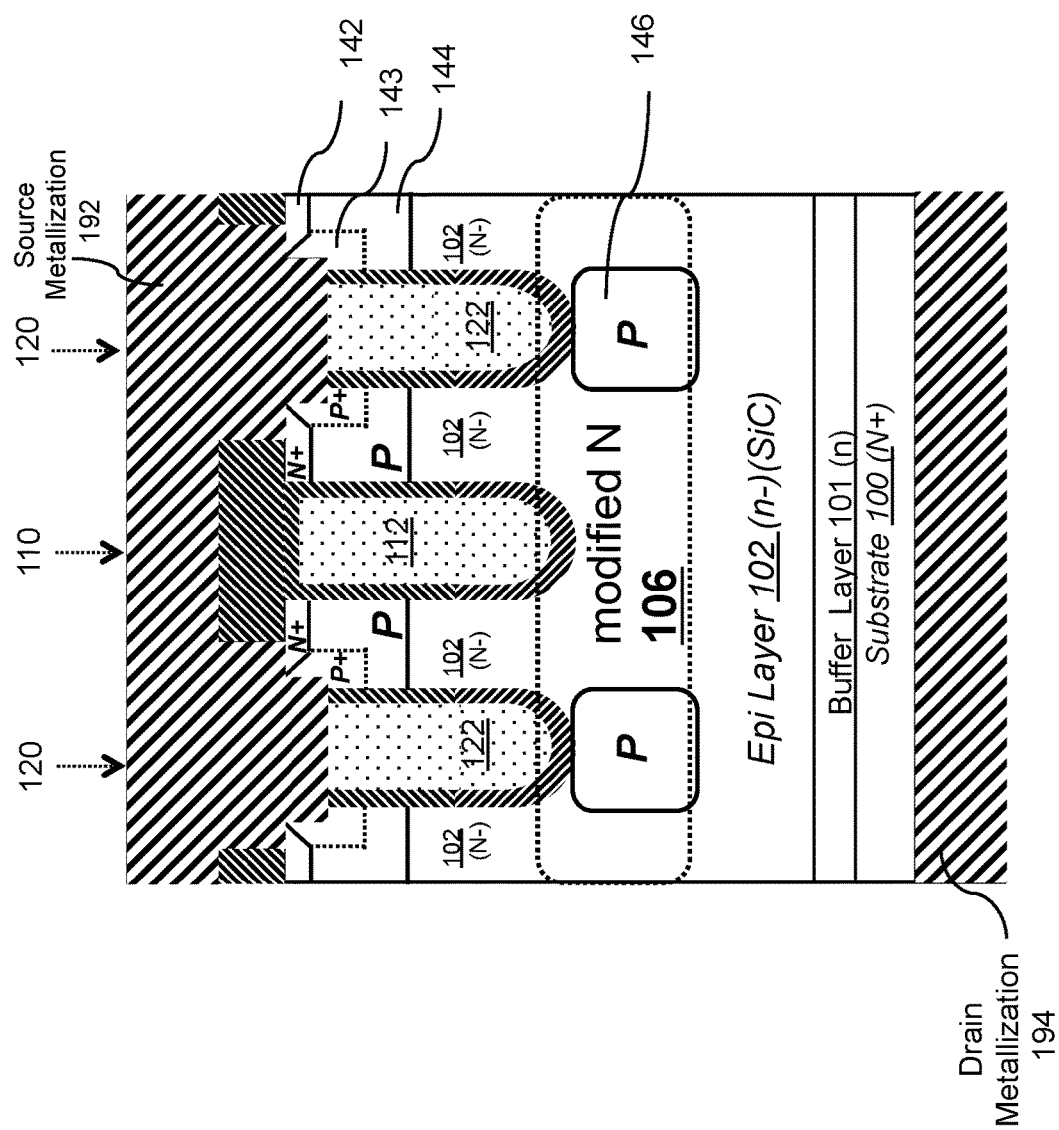
Figure 21B:
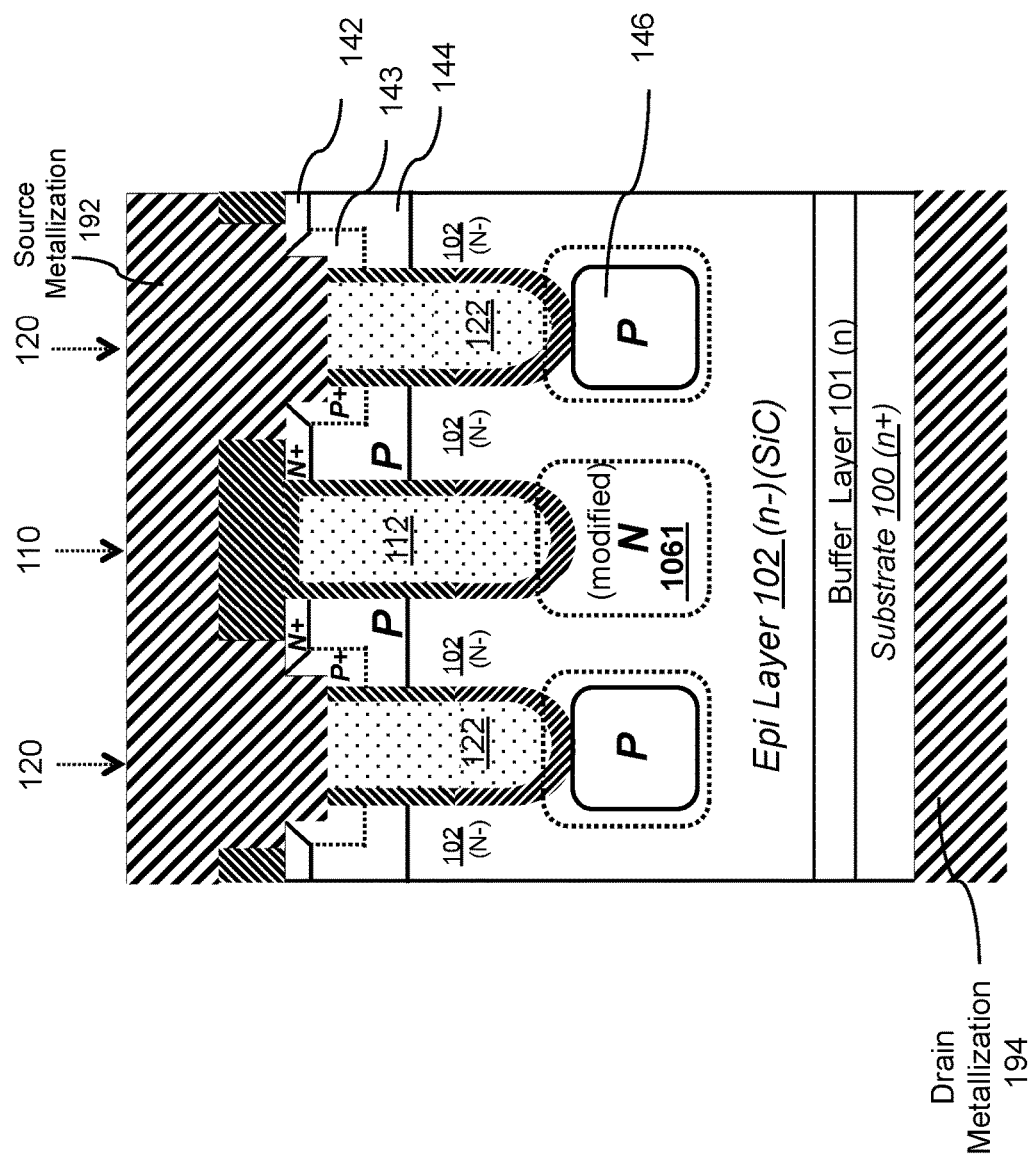
Figure 22:
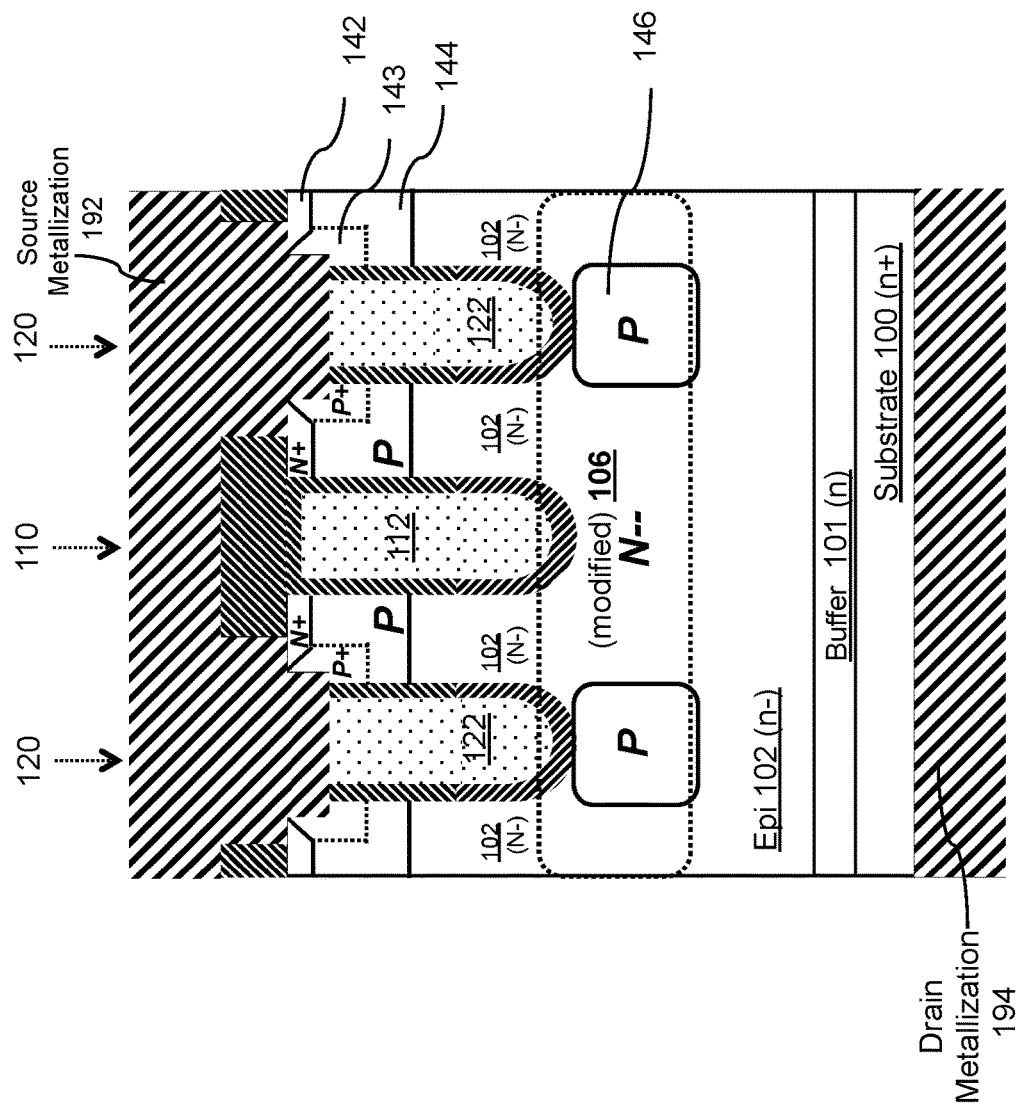

Next, patterned resist 602 is used to protect the active gate trench 110, and then acceptor dopant (such as Al or B) is implanted into N/N– epitaxial layer 102 through the field plate trench 120, as shown in FIG. 19. This implant will form the P-Shield region 146 underneath the trenches 120.

The implantation can be adjusted to optimize the P-Shield profile along the field plate trench sidewall and the depth of P-Shield.

Figure 20:
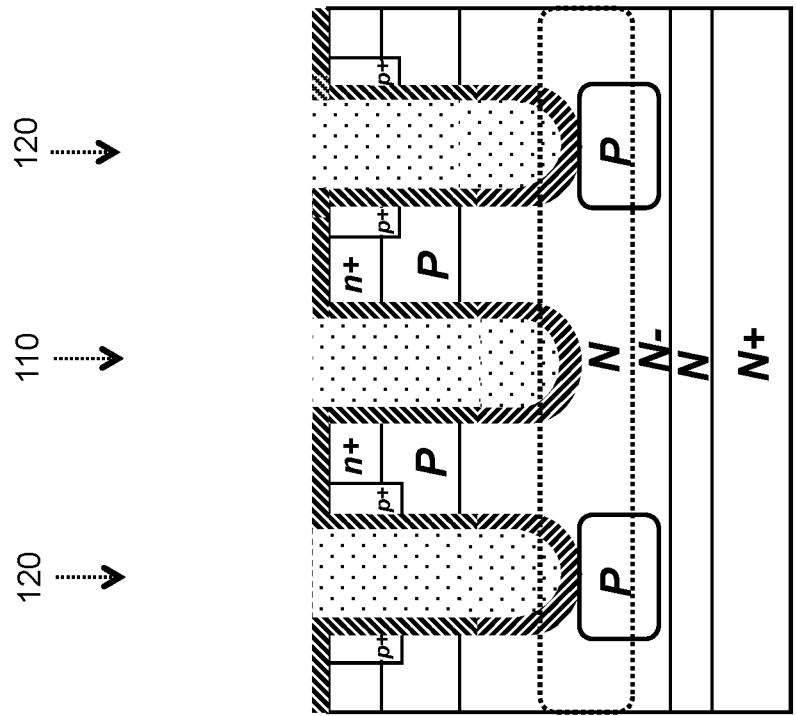

After complete removal of the BOX photo resist 602 and surface oxide layers, a high temperature process (>1600° C.) in Ar ambient is carried out to anneal and activate all of implanted dopants with a carbon cap layer 702 in place for protection. This is depicted in FIG. 20.

At this point, all of high temperature processes are finished (except for the final gate oxide anneal).

Now, the gate formation process is done as described above, ending with a culminating anneal in an oxidizing nitrogen-rich ambient (e.g. with $N_2O$ or NO). The anneal temperature, in this example, is between 1100° C. to 1350° C. No high-temperature process steps should follow the gate oxide anneal.

This culminating gate oxide anneal maximizes the quality of the semiconductor-to-oxide interface. Surprisingly, this culminating anneal also provides improvement in the radiation-hardness of the final device.

The gate electrode 112 and field plate 122 are now formed, e.g. by deposition and CMP of n+ polysilicon. Following this interlevel dielectric is now formed and etched back. A recess etch is performed, front and backside contact metal layer are formed, and source, drain, and gate metal is deposited. This produces the final structure of FIG. 21(*a*) or FIG. 21(*b*) (if modified region 106 in FIG. 21(*a*) or region 1061 in FIG. 21(*b*) has enhanced doping), or the final structure of FIG. 22 (if modified region 106 was partly counterdoped).

Figure 24:
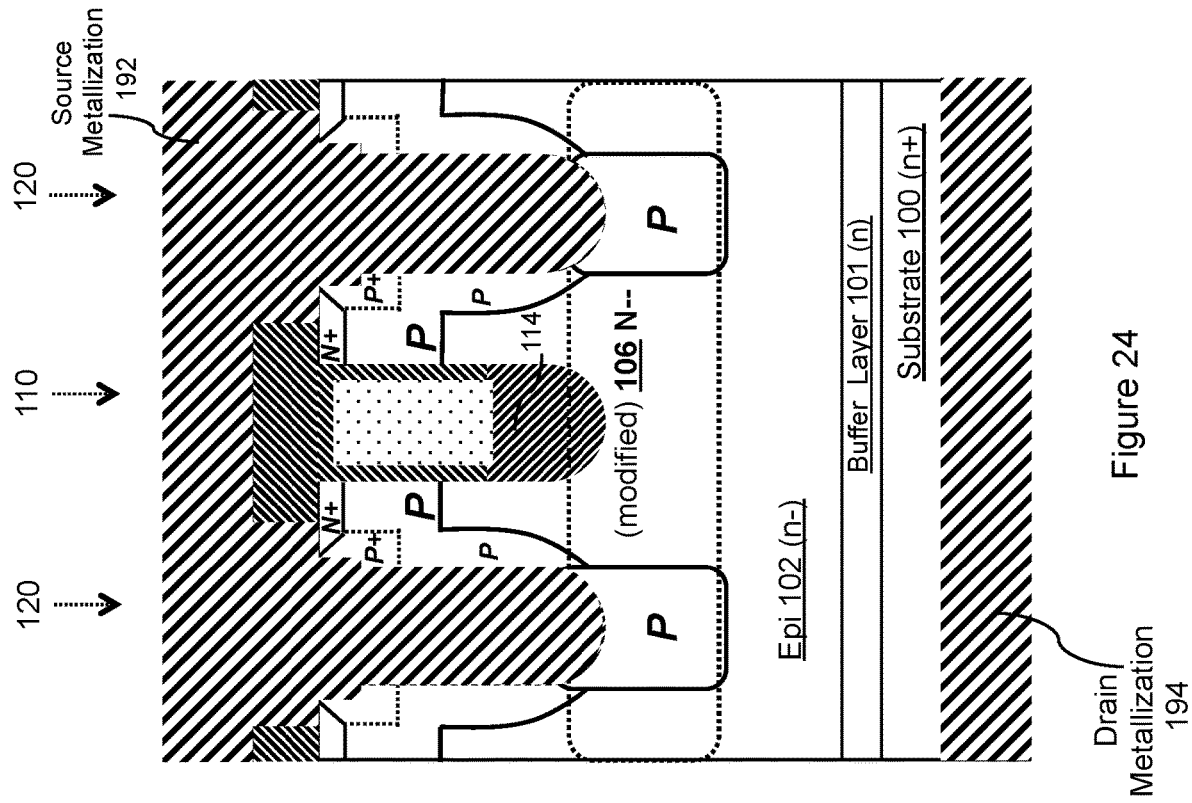
FIG. 23 and FIG. 24 show alternative devices which do not have the poly field plate in the source contact trench.
Figure 23:
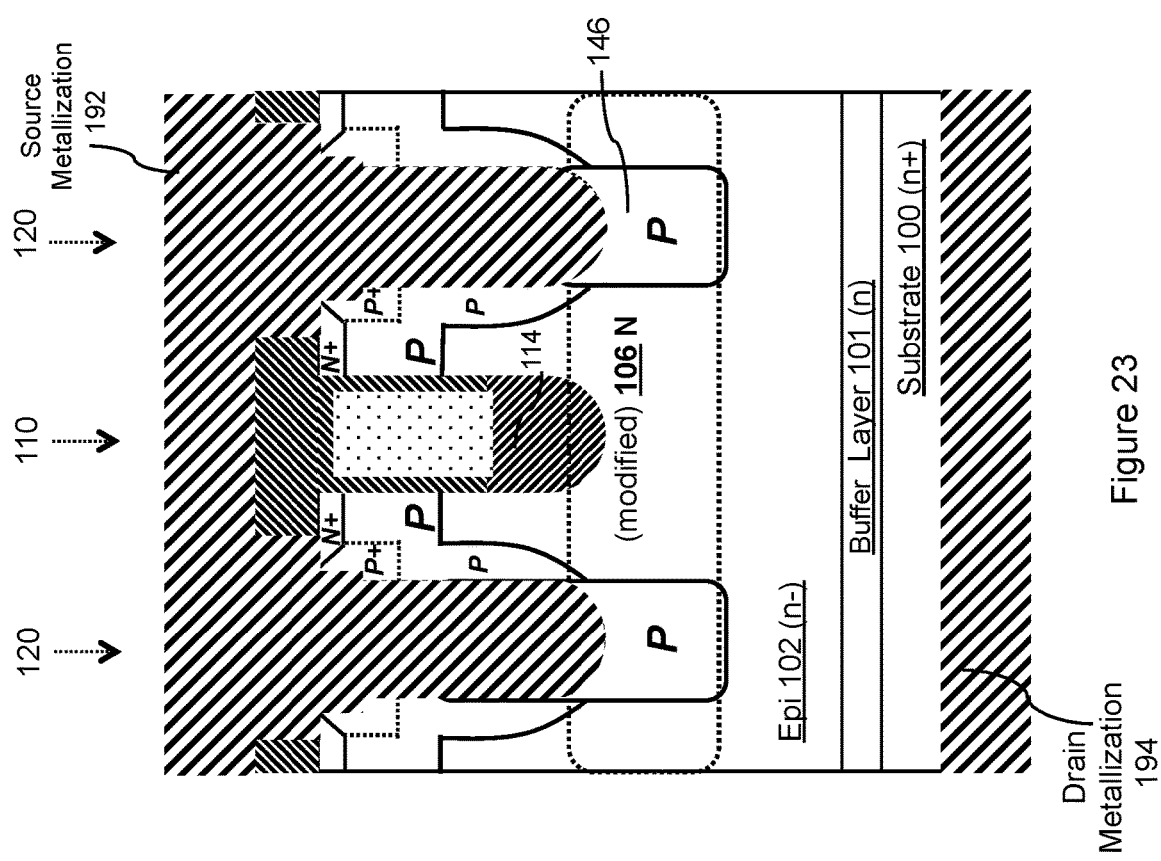

Finally, the process flow described above can also be employed to produce different device variants. For example, FIG. 23 and FIG. 24 show devices without the poly field plate in the source contact trench, but with only the P-Shield regions. Note also that a tilted implant was used to produce extended shield regions in these examples.

Figure 25:
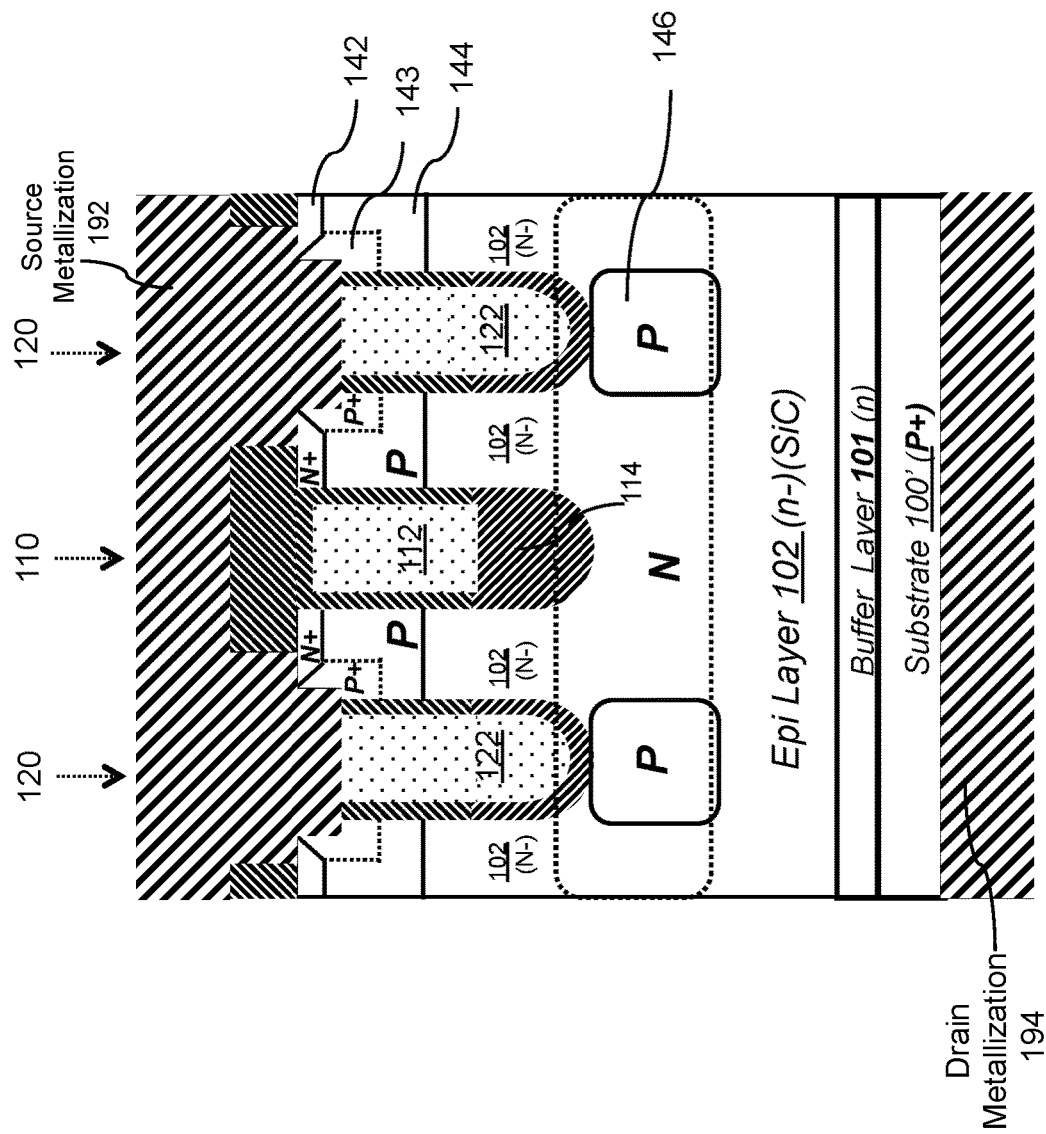
FIG. 25 shows an example of an IGBT device which uses the disclosed innovations.

Additionally, by replacing the n+ substrate 100 with a p+ substrate 100, the process is ready to be used for fabrication of a SiC trench-gated IGBT device as shown in FIG. 25.

Heterostructure Devices

The new processes discussed above can also be utilized to produce the depletion mode trench-gated MOSFET or radiation hardened trench-gated MOSFET in heterostructure devices, using (for example) both Si and SiC (or other combinations of different semiconductor materials).

Figure 26A:
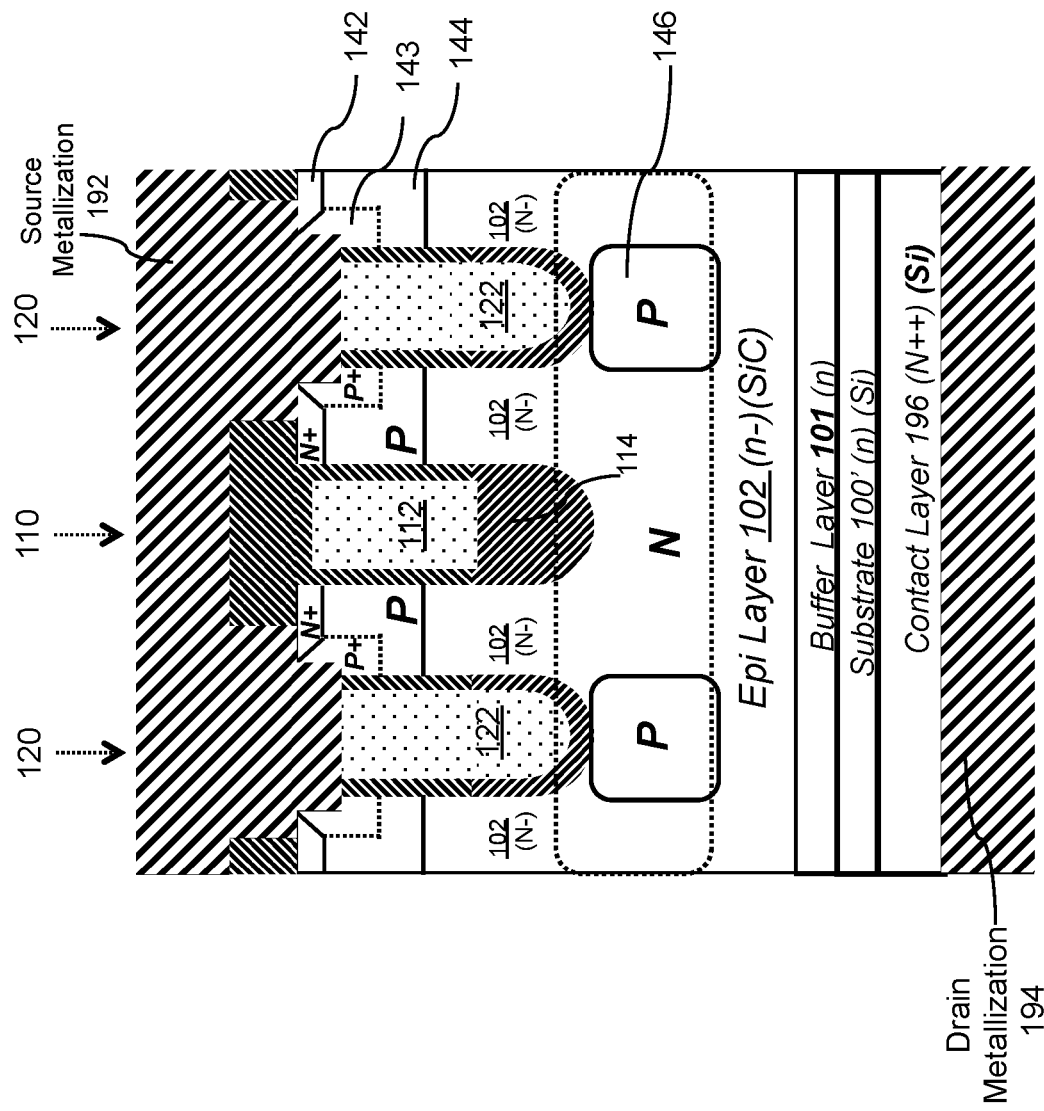
FIG. 26(a) shows an example of a vertical trench-gated transistor in which the drift region and substrate are made of different semiconductor materials.
Figure 26B:
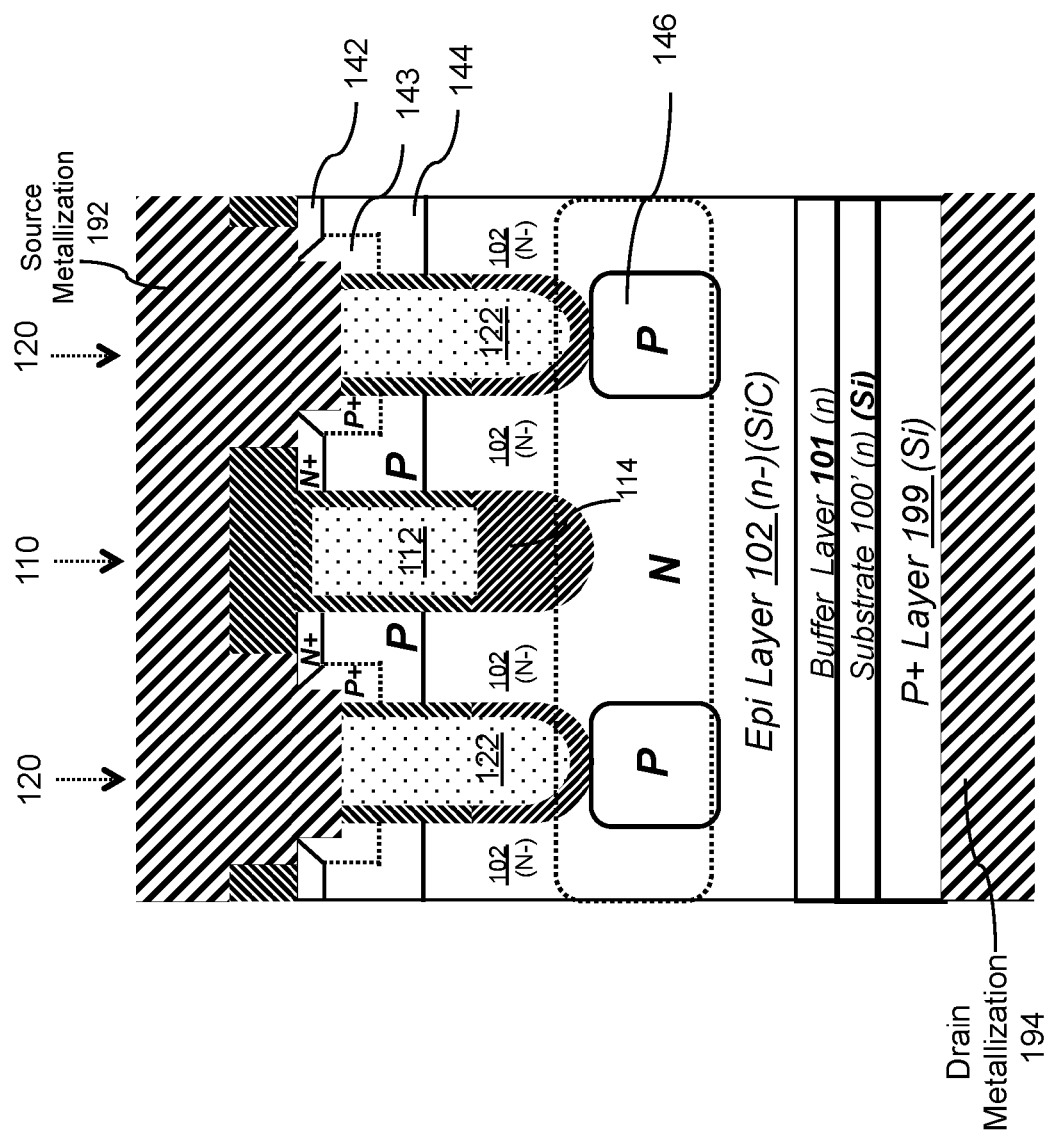
FIG. 26(b) shows an example of an IGBT device constructed similarly to the transistor of FIG. 26(a).

FIG. 26(*a*) shows an example of a vertical trench-gated transistor in which the drift region 102 is made of an epitaxial layer of silicon carbide (or alternatively an analogous wide-bandgap semiconductor), while the substrate 100' is made of silicon (or an analogous semiconductor material which has a narrower bandgap than the epitaxial layer 102). Preferably the epitaxial layer and substrate have a reasonably close lattice match; optionally, as shown, a buffer layer 101 can be included at this transition to reduce strain. Of course, for an n-channel device, the buffer layer 101 will normally be n-type. This is a heterostructure device.

FIG. 26(*b*) shows an example of an IGBT device constructed similarly to the transistor of FIG. 26(*a*). Note the presence of a P+ collector layer 199 next to the collector metallization 194, to provide minority carrier emission in the ON-state. (This provides lower on-resistance for the IGBT structure than for the corresponding transistor structure, but results in slower turnoff.)

Figure 27A:
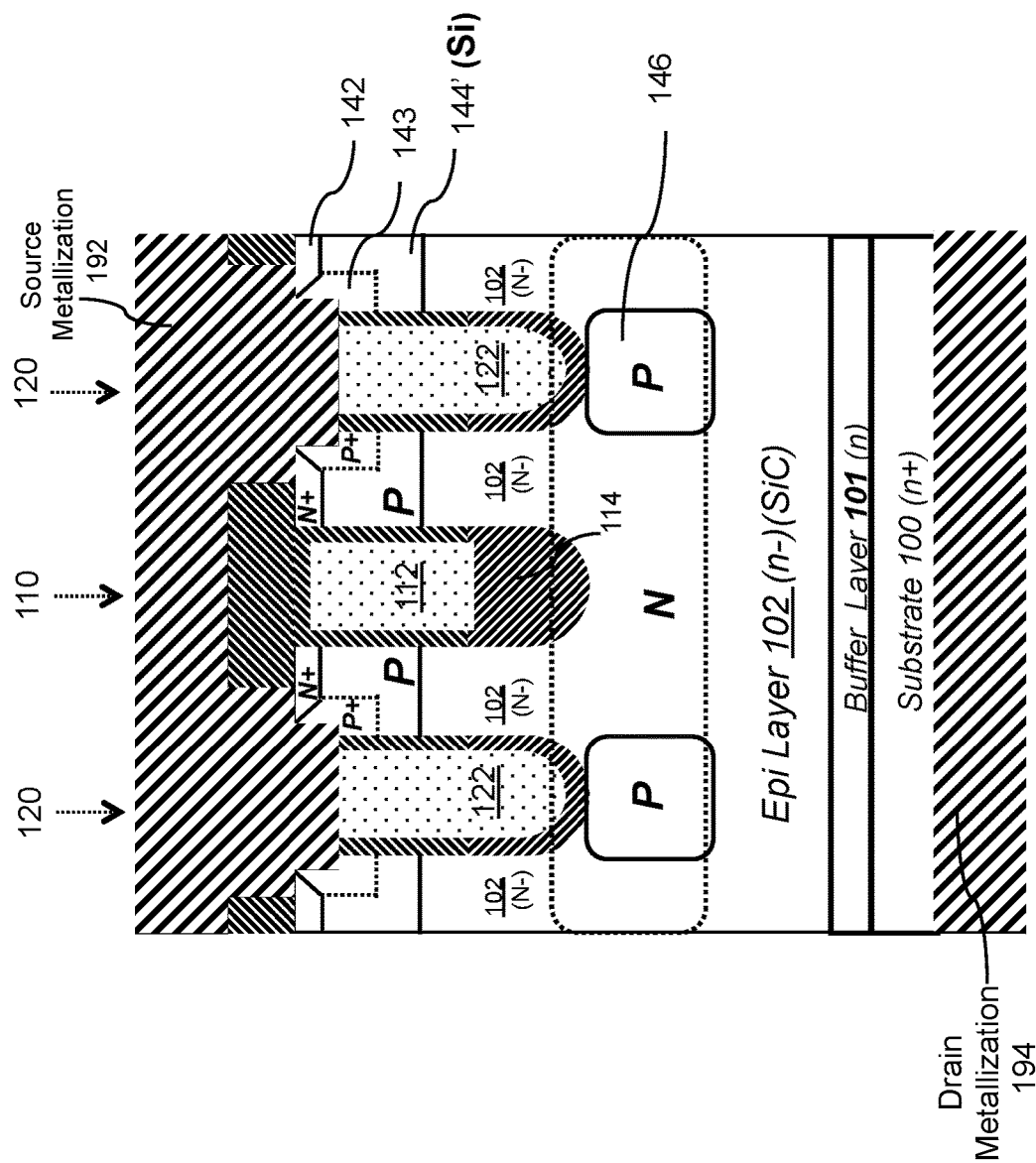
FIG. 27(a) shows an example of a vertical trench-gated transistor in which the drift region 102 is made of an epitaxial layer of silicon carbide (or alternatively an analogous wide-bandgap semiconductor), while the body region 144' is made of silicon (or an analogous semiconductor material which has a narrower bandgap than the epitaxial layer 102).
Figure 27B:
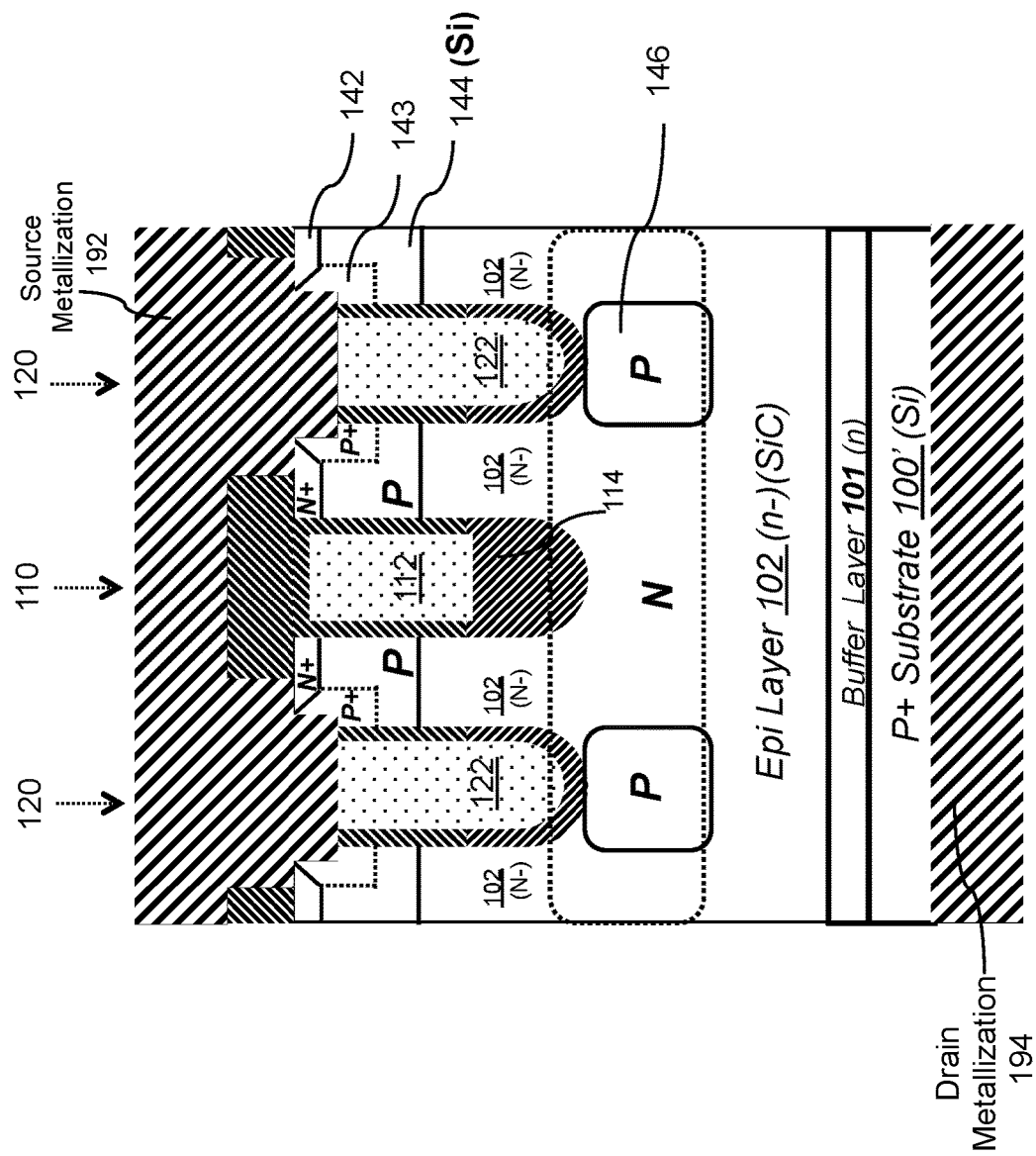
FIG. 27(b) shows an example of an IGBT device constructed similarly to the transistor of FIG. 27(a).

FIG. 27(*a*) shows an example of a vertical trench-gated transistor in which the drift region 102 is made of an epitaxial layer of silicon carbide (or alternatively an analogous wide-bandgap semiconductor), while the body region 144' is made of silicon (or an analogous semiconductor material which has a narrower bandgap than the epitaxial layer 102). By replacing the SiC P-body region 144 with silicon 144', the channel resistance is reduced significantly due to silicon's higher electron mobility. The silicon P-body 144' can be formed over the SiC epitaxial layer by a further epitaxial deposition. This again leads a lower on-resistance for low voltage power MOSFET. This is a heterostructure device.

FIG. 27(*b*) shows an example of an IGBT device constructed similarly to the transistor of FIG. 27(*a*). Note the use of a P+ substrate 100 next to the collector metallization 142, to provide minority carrier emission in the ON-state. (This provides lower on-resistance for the IGBT structure than for the corresponding transistor structure, but results in slower turnoff.)

Double-Heterostructure Devices

Figure 28A:
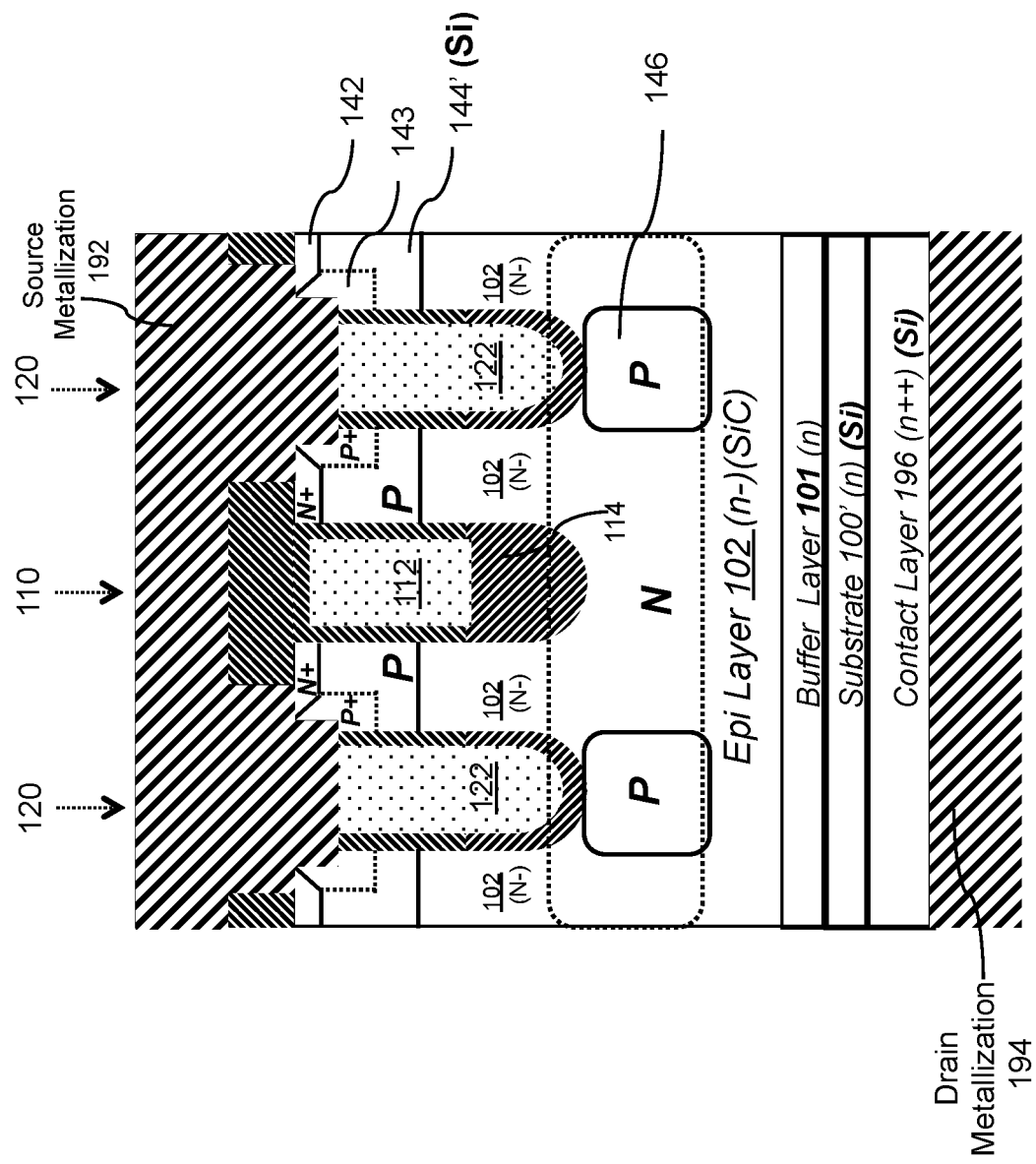
FIG. 28(a) shows an example of a double heterostructure vertical trench-gated transistor, which uses three different semiconductor materials.
Figure 28B:
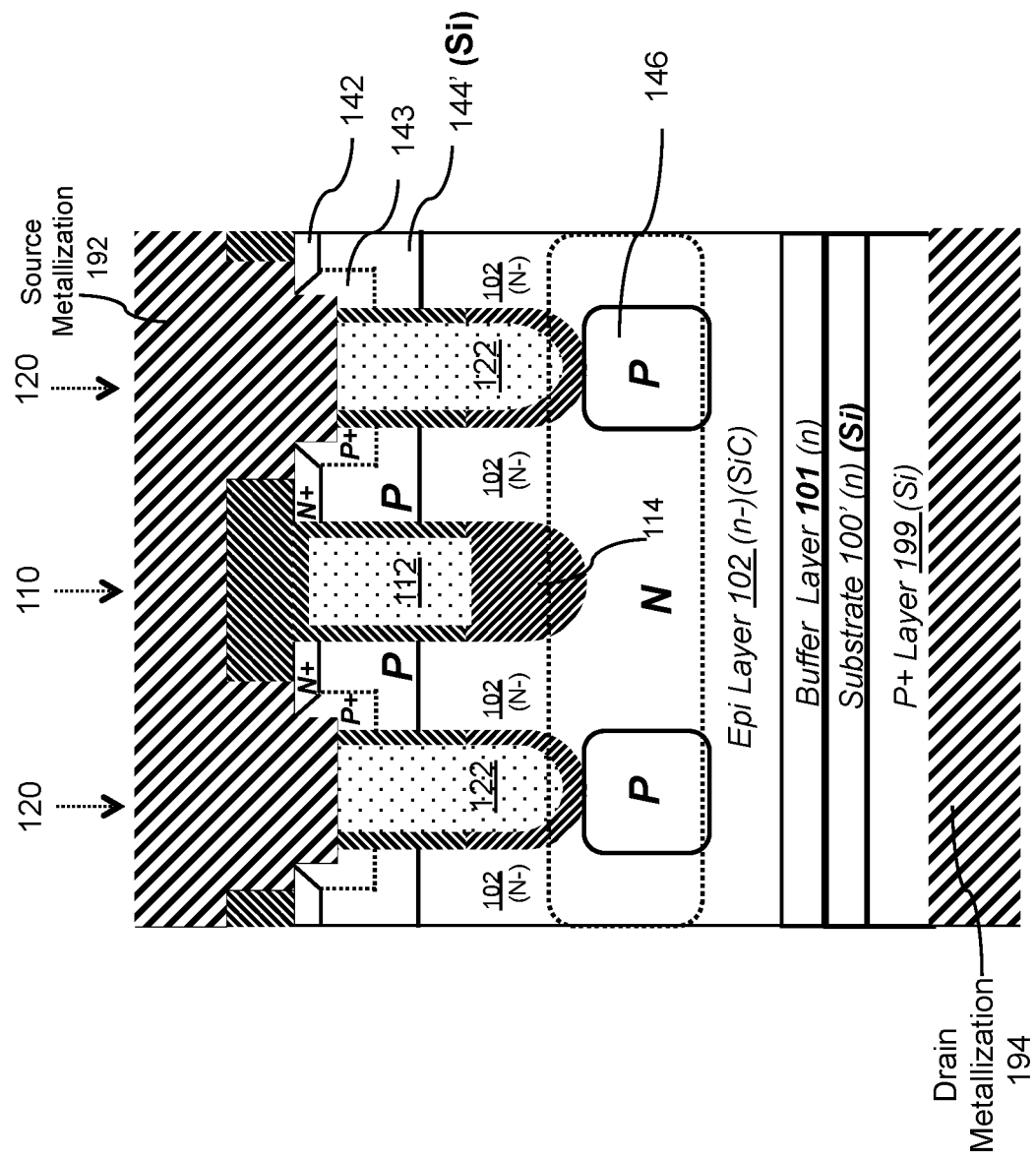
FIG. 28(b) shows an example of an IGBT device constructed similarly to the transistor of FIG. 28(a).

FIG. 28(*a*) shows an example of a double heterostructure device. In this example a vertical trench-gated transistor is modified to use three different semiconductor materials: 1) the drift region 102 is made of a heteroepitaxial layer of silicon carbide (or alternatively an analogous wide-bandgap semiconductor) over 2) a substrate 100' made of silicon (or an analogous semiconductor material which has a narrower bandgap than the epitaxial layer 102). In addition, 3) the body region 144' is made of silicon (or an analogous semiconductor material which has a higher carrier mobility than the epitaxial layer 102). By replacing the SiC P-body region 144 with silicon 144', the channel resistance is reduced significantly due to silicon's higher electron mobility. The silicon P-body 144' can be formed over the SiC epitaxial layer 102 by a further epitaxial deposition. The mixed layer configuration in FIG. 28(*a*) opens the possibility for SiC devices to penetrate into low voltage power MOSFET applications, with lower on-resistance compared to current pure Si based low voltage Power MOSFET.

FIG. 28(*b*) shows an example of an IGBT device constructed similarly to the transistor of FIG. 28(*a*). Note the presence of a P+ minority carrier emission layer 199 next to the collector metallization 194, to provide minority carrier emission in the ON-state. (This provides lower on-resistance for the IGBT structure than for the corresponding transistor structure, but results in slower turnoff.)

Figure 29A:
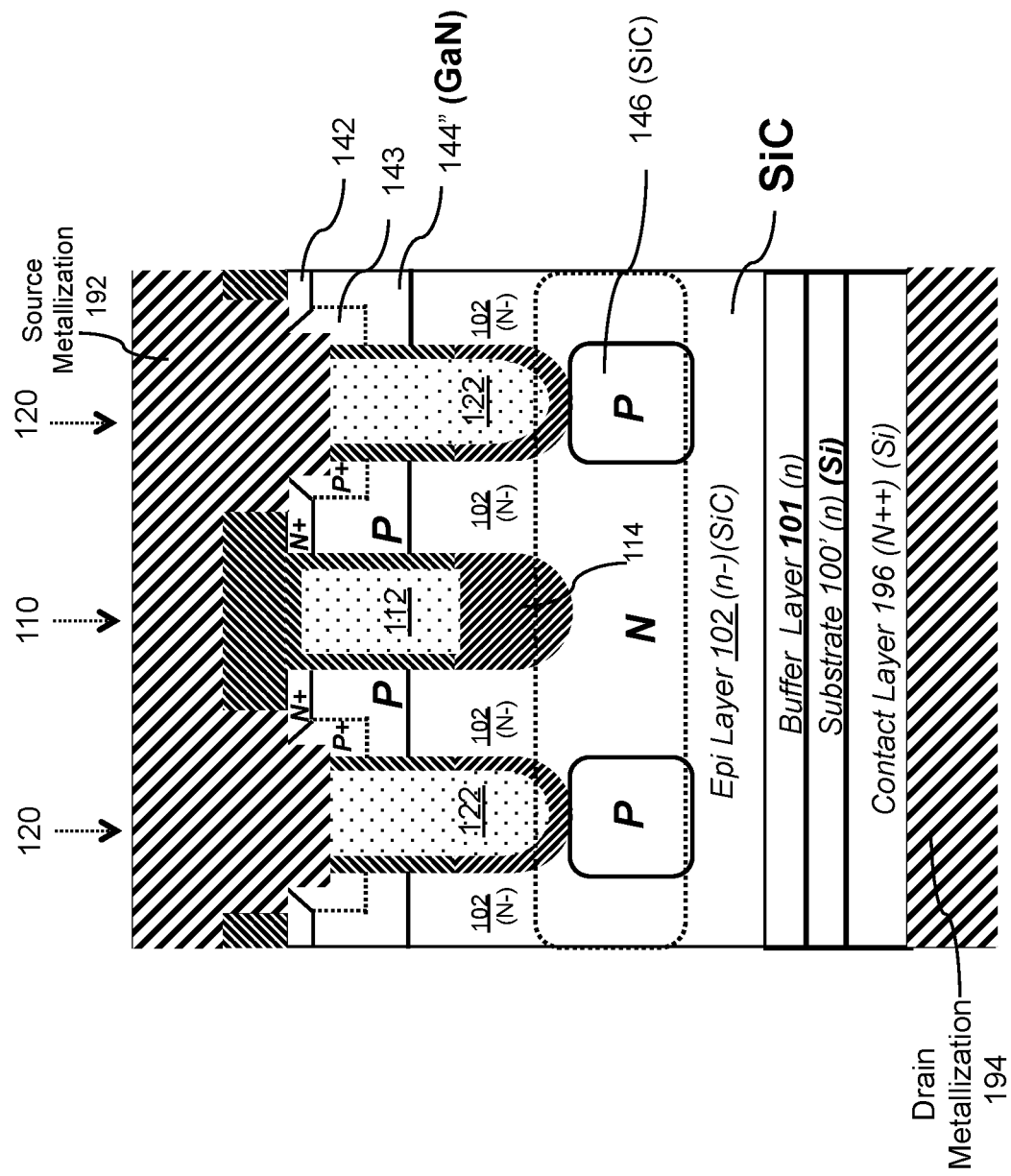
FIG. 29(a) shows an example of a different double-heterostructure vertical trench-gated transistor.
Figure 29B:
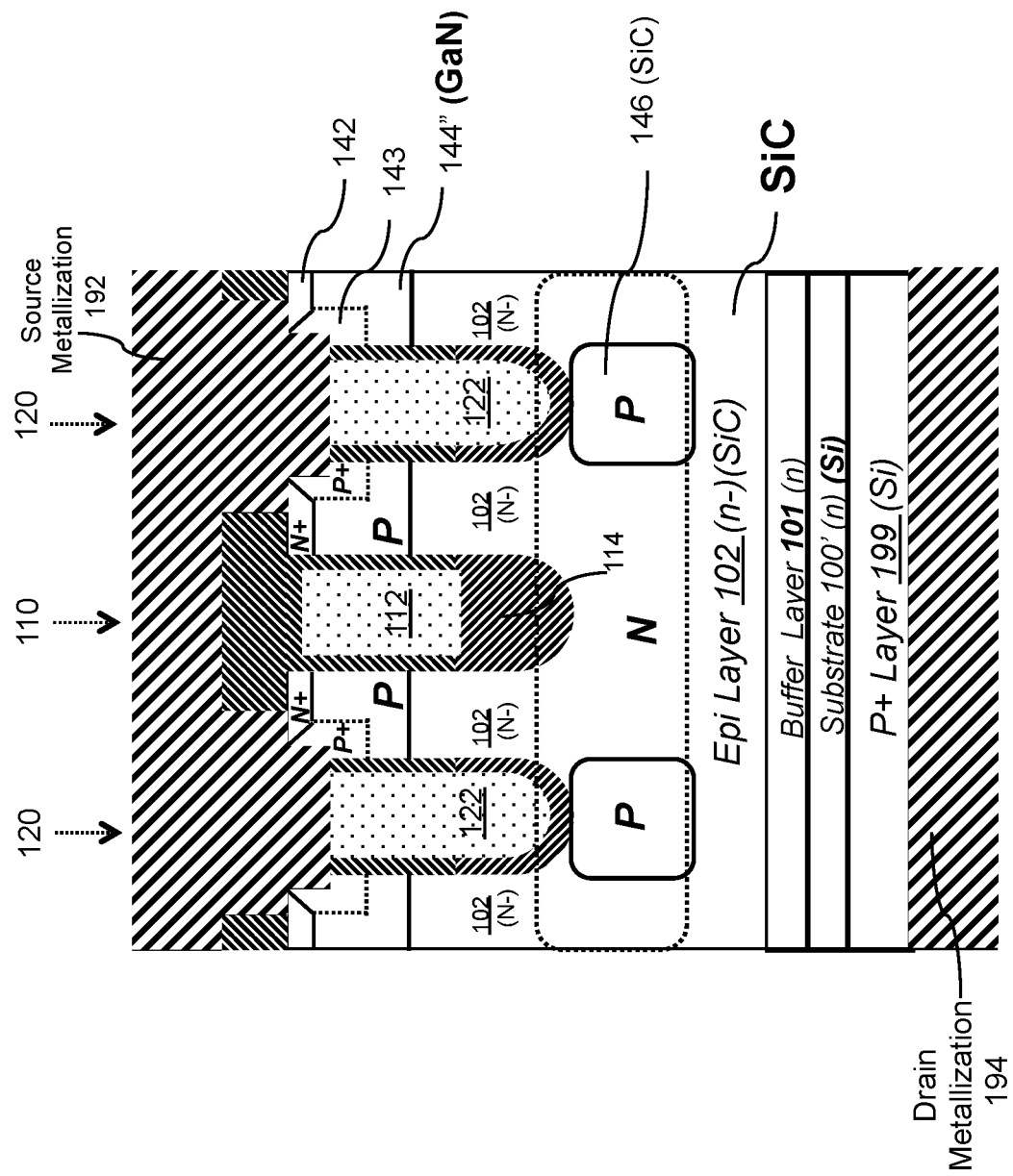
FIG. 29(b) shows an example of an IGBT device constructed similarly to the transistor of FIG. 29(a).

FIG. 29(*a*) shows an example of a different double-heterostructure vertical trench-gated transistor. In this implementation, unlike that of FIG. 28(*a*), the body region 144" is formed from a III-N semiconductor (e.g. GaN). The drift region 102 is made of an epitaxial layer of silicon carbide (or alternatively an analogous wide-bandgap semiconductor), while the substrate 100' is made of silicon (or an analogous semiconductor material which has a narrower bandgap than the epitaxial layer 102). It is believed that GaN on top of SiC layer has a reduced bulk defects, and as the result, the body diode of this device has a more reliable operation. (In this example, an n++ region 196 is used under the drain metallization 194, to reduce contact resistance.) Also, using the GaN over SiC in the channel region can reduce the channel resistance significantly, since the channel carrier mobility of GaN is much higher than that of SiC. By utilizing the mixed layer configuration in FIG. 29(*a*), it opens the possibility of SiC devices penetrating into low voltage power MOSFET applications, with lower on-resistance compared to current pure Si based low voltage Power MOSFET.

FIG. 29(*b*) shows an example of an IGBT device constructed similarly to the transistor of FIG. 29(*a*). Note the presence of a P+ layer 199 next to the collector contact, to provide minority carrier emission in the ON-state. (This provides lower on-resistance for the IGBT structure structure, but results in slower turnoff.)

Figure 30:
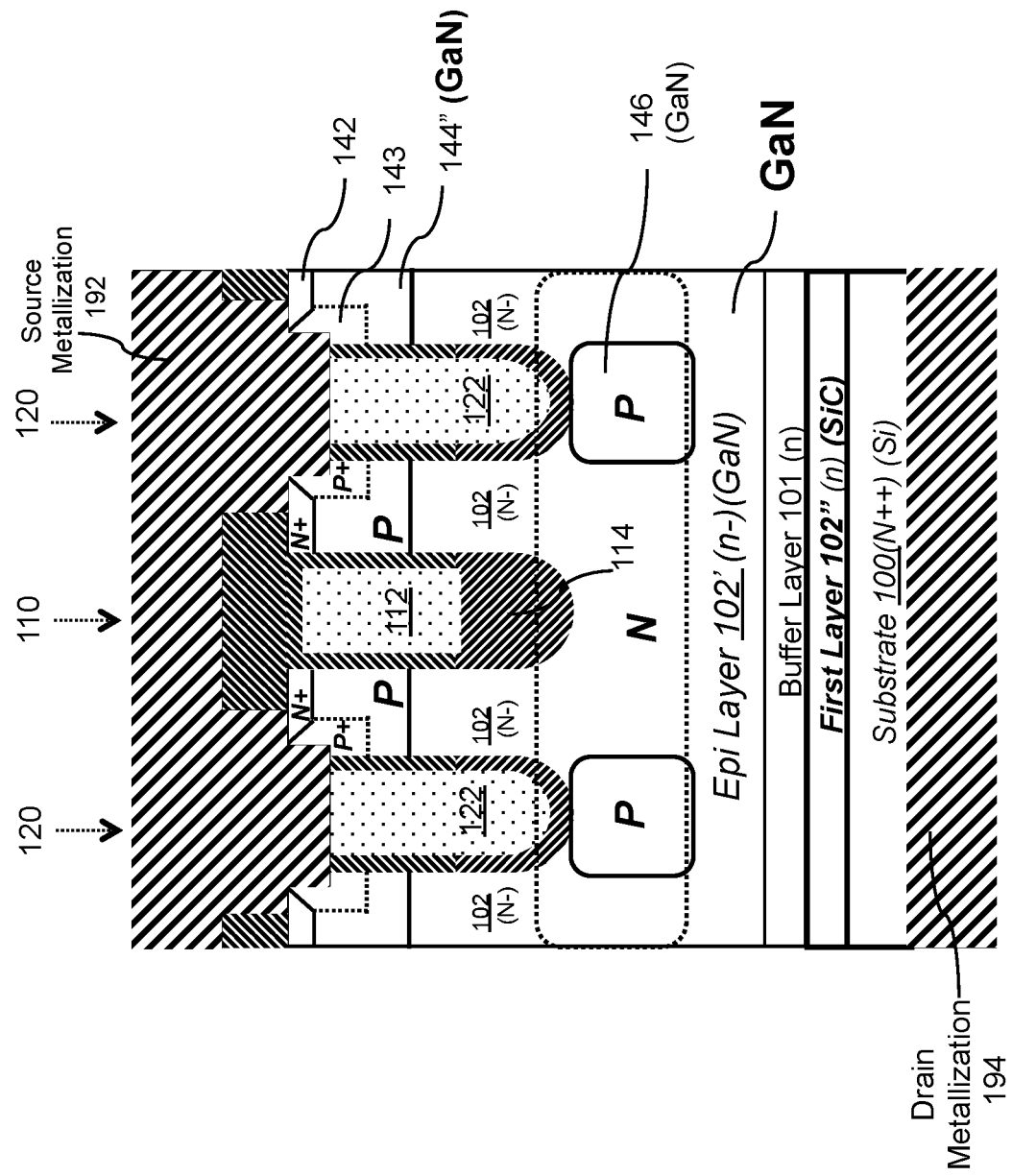
FIG. 30 shows an example of a different double-heterostructure device.

FIG. 30 shows an example of a different double-heterostructure device. This device has a fabrication sequence somewhat analogous to that of FIG. 29(*a*), except that the III-N over IV heteroepitaxy step is performed to a greater thickness, so that the drift region 102' is formed in an epitaxial III-N layer (GaN in this example). As with the device of FIG. 29(*a*), the superior mobility characteristics of GaN are believed to be advantageous is reducing on-state channel resistance. The use of a SiC first layer 102" over a silicon substrate 100' still helps to provide a high breakdown voltage.

Figure 31:
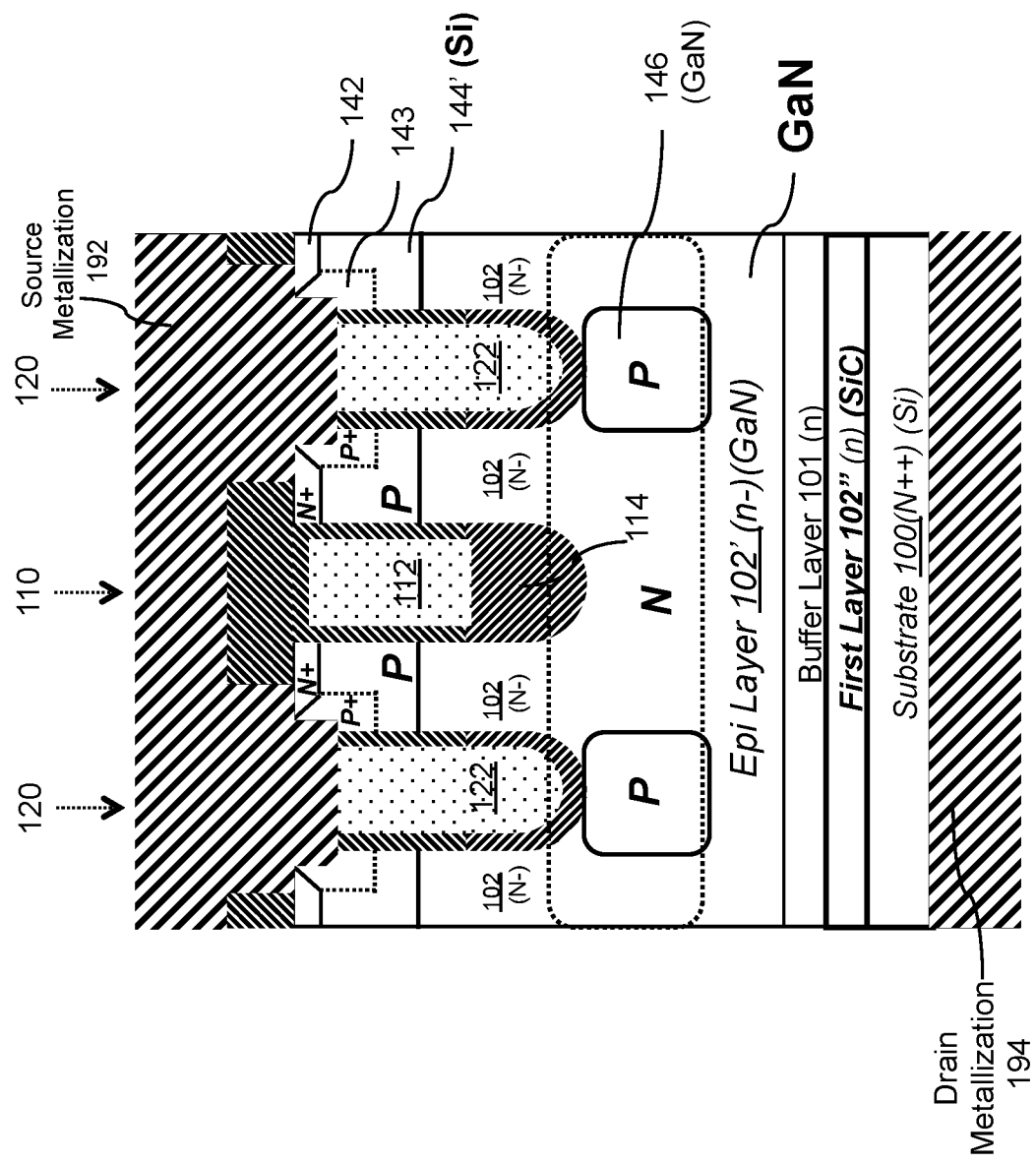
FIG. 31 shows an example of a more complex heterostructure device.

FIG. 31 shows an example of a more complex heterostructure device. This synergistically combines features of several of the above devices, including a lower-bandgap body layer 144' (silicon), a higher-mobility drift region 102' (GaN), a SiC first epi layer 102", and a lower-bandgap substrate 100' (silicon).

Advantages

The disclosed innovations, in various embodiments, provide one or more of at least the following advantages. However, not all of these advantages result from every one of the innovations disclosed, and this list of advantages does not limit the various claimed inventions.

Ability to build power semiconductor devices in high-bandgap semiconductor materials;
Improved silicon carbide semiconductor devices;
Improved quality of semiconductor-to-oxide interface at the gate dielectric;
Improved quality of gate dielectric;
Power semiconductor devices with higher breakdown voltage;
Power semiconductor devices with lower on-resistance;
Power semiconductor devices with lower cost; and
Power semiconductor devices which can operate at higher temperatures.

According to some but not necessarily all embodiments, there is provided: Heterostructure and double-heterostructure trench-gate devices, in which the substrate and/or the body are constructed of a narrower-bandgap semiconductor material than the uppermost portion of the drift region. Fabrication most preferably uses a process where gate dielectric anneal is performed after all other high-temperature steps have already been done.

According to some but not necessarily all embodiments, there is provided: A double-heterostructure semiconductor device structure, comprising: at least one layer of a first semiconductor material epitaxially overlying at least one layer of a second semiconductor material which epitaxially overlies at least one layer of a third semiconductor material; wherein the first and third semiconductor materials are each different from the second semiconductor material; a first-conductivity-type source region surrounded by a second-conductivity-type body region, formed in the first semiconductor material; a first-conductivity-type drift region abutting the body region, and formed in the second semiconductor material; a gate which is positioned in a first trench within said semiconductor layer, and is capacitively coupled to control vertical conduction from the source region through portions of the body region near said trench; recessed field plates, positioned in proximity to and capacitively coupled to said semiconductor material; said recessed field plates being positioned in respective second trenches; wherein the first and second trenches both extend through the first semiconductor material down into the second semiconductor material; a first additional diffusion component of a second conductivity type lying at least partially beneath said respective second trenches.

According to some but not necessarily all embodiments, there is provided: A double-heterostructure semiconductor device structure, comprising: at least one layer of a first semiconductor material epitaxially overlying at least one layer of a second semiconductor material which epitaxially overlies at least one layer of a third semiconductor material; wherein the first and third semiconductor materials are each different from the second semiconductor material; a first-conductivity-type source or emitter region surrounded by a second-conductivity-type body region, formed in the first semiconductor material; a first-conductivity-type drift region abutting the body region, and formed in the second semiconductor material; a gate which is positioned in a first trench within said semiconductor layer, and is capacitively coupled to control vertical conduction from the source region through portions of the body region near said trench.

According to some but not necessarily all embodiments, there is provided: A semiconductor device structure, comprising: at least one layer of a first semiconductor material epitaxially overlying at least one layer of a second semiconductor material which epitaxially overlies at least one layer of a third semiconductor material which epitaxially overlies at least one layer of a fourth semiconductor material; wherein the first and third semiconductor materials are each different from the second semiconductor material, and the fourth semiconductor material is different from the third semiconductor material; a first-conductivity-type source or emitter region which is ohmically connected to a first current-carrying metallization, and which is surrounded by a second-conductivity-type body region, formed in the first semiconductor material; a first-conductivity-type drift region abutting the body region, and formed in the second semiconductor material; a gate which is positioned in a first trench within said semiconductor layer, and is capacitively coupled to control vertical conduction from the source region through portions of the body region near said trench, and thereby through portions of the drift region; a first-conductivity-type portion of the third semiconductor material; and a second current-carrying metallization which is connected to the first-conductivity-type portion of the third semiconductor material through a portion of the fourth semiconductor material.

According to some but not necessarily all embodiments, there is provided: A semiconductor device structure, comprising: in a semiconductor mass consisting essentially, at upper portions thereof, of an uppermost epitaxial layer of a first semiconductor material overlying a layer of a second semiconductor material having a second bandgap which is larger than the bandgap of the first semiconductor material, a gate which is positioned in a first trench within said semiconductor layer, and is capacitively coupled to control vertical conduction from a first-conductivity-type source through second-conductivity-type portions of said layer near said trench; recessed field plates, positioned in proximity to and capacitively coupled to said semiconductor material; said recessed field plates being positioned in respective second trenches; a first additional diffusion component of a second conductivity type lying at least partially beneath said respective second trenches; and a second additional diffusion component of said first conductivity type lying at least partially within said second-conductivity-type portions of said layer; whereby said first additional diffusion component reduces depletion of said second-conductivity-type portions of said layer in the OFF state; and whereby said second additional diffusion component reduces the on-resistance of the device in the ON state.

According to some but not necessarily all embodiments, there is provided: A power semiconductor device fabrication process, comprising: in a semiconductor mass consisting essentially of silicon carbide, forming, in any order, a first-conductivity-type source region, a second-conductivity-type body region which forms a junction with first-conductivity-type bulk material lying therebelow, first and second trenches, each extending deeper than the body region, a second-conductivity-type shield regions lying below said first trenches but not below said second trenches, and an additional doping modification component lying within the first-conductivity-type bulk material of the semiconductor mass; applying heat to activate dopants in the source region, the body region, the shield region, and the additional doping modification component; performing insulated gate fabrication, by forming a thin gate dielectric comprising a silicon oxide on sidewalls of the second trenches, annealing the thin gate dielectric at a temperature above 1000 degrees C. in a nitrogen-rich oxidizing atmosphere, and forming a conductive gate electrode over the thin gate dielectric; and forming metallization to complete fabrication of an operative device; wherein no non-transient heating step above 1200 degrees C. is applied after the step of performing insulated gate fabrication is finished.

According to some but not necessarily all embodiments, there is provided: A power semiconductor device fabrication process, comprising: in a semiconductor mass, forming, in any order, a first-conductivity-type carrier emission region, a second-conductivity-type body region which forms a junction with first-conductivity-type bulk material lying therebelow, a first and second trenches, each extending deeper than the body region, second-conductivity-type shield regions lying below said first trenches but not below said second trenches, and an additional doping modification component lying within the first-conductivity-type bulk material of the semiconductor mass; applying heat to activate dopants in the carrier emission region, the body region, the shield region, and the additional doping modification component; performing insulated gate fabrication, by forming a thin gate dielectric comprising a silicon oxide on sidewalls of the second trenches, annealing the thin gate dielectric at a temperature above 1000 degrees C. in a nitrogen-rich oxidizing atmosphere, and forming a conductive gate electrode over the thin gate dielectric; and forming metallization to complete fabrication of an operative device; wherein no non-transient heating step above 1200 degrees C. is applied after the step of performing insulated gate fabrication is finished.

According to some but not necessarily all embodiments, there is provided: a silicon carbide (or comparable) trench transistor in which gate dielectric anneal, in an oxynitriding atmosphere, is performed after all other high-temperature steps have already been done.

According to some but not necessarily all embodiments, there is provided: A power semiconductor device fabrication process, comprising: in a semiconductor mass, forming, in any order, a first-conductivity-type carrier emission region, a second-conductivity-type body region which forms a junction with first-conductivity-type bulk material lying therebelow, first and second trenches, each extending deeper than the body region, second-conductivity-type shield regions lying below said first trenches but not below said second trenches, and an additional doping modification component lying within the first-conductivity-type bulk material of the semiconductor mass; applying heat to activate dopants in the carrier emission region, the body region, the shield region, and the additional doping modification component; performing insulated gate fabrication, by forming a thin gate dielectric comprising a silicon oxide on sidewalls of the second trenches, annealing the thin gate dielectric in a nitrogen-rich oxidizing atmosphere, and forming a conductive gate electrode over the thin gate dielectric; and forming metallization to complete fabrication of an operative device; wherein no non-transient heating step, after the step of performing insulated gate fabrication, uses a temperature within 100 degrees C. of the maximum temperature of the insulated gate fabrication step.

According to some but not necessarily all embodiments, there is provided: A power semiconductor device fabrication process, comprising: a) in a semiconductor mass, forming, in any order, a first-conductivity-type carrier emission region, a second-conductivity-type body region which forms a junction with first-conductivity-type bulk material lying therebelow, first and second trenches, each extending deeper than the body region, and a second-conductivity-type shield regions lying below said first trenches but not below said second trench; b) applying heat to activate dopants in the carrier emission region, the body region, and the shield region; c) performing insulated gate fabrication, by forming a thin gate dielectric comprising a silicon oxide on sidewalls of the second trenches, annealing the thin gate dielectric at a temperature above 1000 degrees C. in a nitrogen-rich oxidizing atmosphere, and forming a conductive gate electrode over the thin gate dielectric; and d) forming metallization to complete fabrication of an operative device; wherein no non-transient heating step above 1200 degrees C. is applied after the step of performing insulated gate fabrication is finished.

According to some but not necessarily all embodiments, there is provided: A power semiconductor device fabrication process, comprising: a) in a semiconductor mass, forming, in any order, a first-conductivity-type carrier emission region, a second-conductivity-type body region which forms a junction with first-conductivity-type bulk material lying therebelow, a first and second trenches, each extending deeper than the body region, and second-conductivity-type shield regions lying below said first trenches but not below said second trenches; b) applying heat to activate dopants in the carrier emission region, the body region, the shield region, and the additional doping modification component; c) performing insulated gate fabrication, by forming a thin gate dielectric comprising a silicon oxide on sidewalls of the second trenches, annealing the thin gate dielectric in a nitrogen-rich oxidizing atmosphere, and forming a conductive gate electrode over the thin gate dielectric; and d) forming metallization to complete fabrication of an operative device; wherein no non-transient heating step, after the step of performing insulated gate fabrication, uses a temperature within 100 degrees C. of the maximum temperature of the insulated gate fabrication step.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

While the preferred wide-bandgap semiconductor material is silicon carbide, it should also be noted that other semiconductor materials can optionally be substituted. A primary example of this is Group IV alloys, e.g. one of the SiGeC ternary semiconductor alloys. However, it is also contemplated that the disclosed inventions can be adapted to other wide-bandgap semiconductor materials, such as diamond, GaN, AlGaN, or $Ga_2O_3$.

In the disclosed examples of FIGS. 1-22, the devices fabricated are simple vertical-current-flow field-effect transistors. However, the disclosed inventions can also be used to form other device types which include an insulated gate. One example would be IGBTs (as in FIG. 25), but other possibilities contemplated include MCTs and TMBSs (Trench MOS Barrier Schottky Rectifiers).

It is also contemplated, as a possible but somewhat less advantageous alternative, that the disclosed inventions can also be adapted to formation of a gate oxide which is deposited rather than grown.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A double-heterostructure semiconductor device structure, comprising:
   at least one layer of a first semiconductor material epitaxially overlying at least one layer of a second semiconductor material which epitaxially overlies at least one layer of a third semiconductor material;
   wherein the first and third semiconductor materials are each different from the second semiconductor material;
   a first-conductivity-type source region abutting a second-conductivity-type body region, formed in the first semiconductor material;
   a first-conductivity-type drift region abutting the body region, and formed in the second semiconductor material;
   a gate which is positioned in a first trench within at least said first semiconductor material and said second semiconductor material, and is capacitively coupled to control vertical conduction from the source region through portions of the body region near said trench;
   recessed field plates, positioned in proximity to and capacitively coupled to at least said first semiconductor material and said second semiconductor material; said recessed field plates being positioned in respective second trenches;
   wherein the first and second trenches both extend through the first semiconductor material down into the second semiconductor material; and
   a first additional diffusion component of a second conductivity type lying at least partially beneath said respective second trenches,
   wherein the first semiconductor material is silicon, the second semiconductor material is silicon carbide, and the third semiconductor material is silicon.

2. The double-heterostructure semiconductor device structure of claim 1, further comprising a second additional diffusion component of said first conductivity type lying at least partially within said second-conductivity-type portions of said layer.

3. The double-heterostructure semiconductor device structure of claim 1, wherein the first conductivity type is n-type.

4. The double-heterostructure semiconductor device structure of claim 1, further comprising a drain or collector region formed in the third semiconductor material beneath the drift region.

5. The double-heterostructure semiconductor device structure of claim 1, further comprising a drain or collector region formed in the third semiconductor material beneath the drift region, and a first current-carrying metallization which is ohmically connected to the source or emitter region, and a second current-carrying metallization which is ohmically connected to the drain or collector region.

6. The double-heterostructure semiconductor device structure of claim 1, further comprising a second-conductivity-type collector region formed in the third semiconductor material beneath the drift region.

7. A double-heterostructure semiconductor device structure, comprising:
   at least one layer of a first semiconductor material epitaxially overlying at least one layer of a second semiconductor material which epitaxially overlies at least one layer of a third semiconductor material;
   wherein the first and third semiconductor materials are each different from the second semiconductor material;
   a first-conductivity-type source region abutting a second-conductivity-type body region, formed in the first semiconductor material;
   a first-conductivity-type drift region abutting the body region, and formed in the second semiconductor material;
   a gate which is positioned in a first trench within at least said first semiconductor material and said second semiconductor material, and is capacitively coupled to control vertical conduction from the source region through portions of the body region near said trench;
   recessed field plates, positioned in proximity to and capacitively coupled to at least said first semiconductor material and said second semiconductor material; said recessed field plates being positioned in respective second trenches;
   wherein the first and second trenches both extend through the first semiconductor material down into the second semiconductor material; and
   a first additional diffusion component of a second conductivity type lying at least partially beneath said respective second trenches,
   wherein the first semiconductor material is a III-N semiconductor material, the second semiconductor material is a IV-IV semiconductor alloy, and the third semiconductor material is silicon.

8. A double-heterostructure semiconductor device structure, comprising:
   at least one layer of a first semiconductor material epitaxially overlying at least one layer of a second semiconductor material which epitaxially overlies at least one layer of a third semiconductor material;
   wherein the first and third semiconductor materials are each different from the second semiconductor material;
   a first-conductivity-type source region abutting a second-conductivity-type body region, formed in the first semiconductor material;

a first-conductivity-type drift region abutting the body region, and formed in the second semiconductor material;

a gate which is positioned in a first trench within at least said first semiconductor material and said second semiconductor material, and is capacitively coupled to control vertical conduction from the source region through portions of the body region near said trench;

recessed field plates, positioned in proximity to and capacitively coupled to at least said first semiconductor material and said second semiconductor material; said recessed field plates being positioned in respective second trenches;

wherein the first and second trenches both extend through the first semiconductor material down into the second semiconductor material; and a first additional diffusion component of a second conductivity type lying at least partially beneath said respective second trenches, wherein the first semiconductor material is silicon, the second semiconductor material is a III-N semiconductor material, and the third semiconductor material is a Group IV semiconductor material.

9. A double-heterostructure semiconductor device structure, comprising:

at least one layer of a first semiconductor material epitaxially overlying at least one layer of a second semiconductor material which epitaxially overlies at least one layer of a third semiconductor material;

wherein the first and third semiconductor materials are each different from the second semiconductor material;

a first-conductivity-type source or emitter region surrounded by a second-conductivity-type body region, formed in the first semiconductor material;

a first-conductivity-type drift region abutting the body region, and formed in the second semiconductor material;

a gate which is positioned in a first trench within at least said first semiconductor material, and is capacitively coupled to control vertical conduction from the source region through portions of the body region near said trench, wherein the first semiconductor material is silicon, the second semiconductor material is silicon carbide, and the third semiconductor material is silicon.

10. The double-heterostructure semiconductor device structure of claim 9, further comprising a second additional diffusion component of said first conductivity type lying at least partially within said second-conductivity-type portions of said layer.

11. The double-heterostructure semiconductor device structure of claim 9, wherein the first conductivity type is n-type.

12. The double-heterostructure semiconductor device structure of claim 9, further comprising a drain or collector region formed in the third semiconductor material beneath the drift region.

13. The double-heterostructure semiconductor device structure of claim 9, further comprising a drain or collector region formed in the third semiconductor material beneath the drift region, and a first current-carrying metallization which is ohmically connected to the source or emitter region, and a second current-carrying metallization which is ohmically connected to the drain or collector region.

14. A double-heterostructure semiconductor device structure, comprising:

at least one layer of a first semiconductor material epitaxially overlying at least one layer of a second semiconductor material which epitaxially overlies at least one layer of a third semiconductor material;

wherein the first and third semiconductor materials are each different from the second semiconductor material;

a first-conductivity-type source or emitter region surrounded by a second-conductivity-type body region, formed in the first semiconductor material;

a first-conductivity-type drift region abutting the body region, and formed in the second semiconductor material;

a gate which is positioned in a first trench within at least said first semiconductor material, and is capacitively coupled to control vertical conduction from the source region through portions of the body region near said trench, wherein the first semiconductor material is a III-N semiconductor material, the second semiconductor material is a IV-IV semiconductor alloy, and the third semiconductor material is silicon.

15. A double-heterostructure semiconductor device structure, comprising:

at least one layer of a first semiconductor material epitaxially overlying at least one layer of a second semiconductor material which epitaxially overlies at least one layer of a third semiconductor material;

wherein the first and third semiconductor materials are each different from the second semiconductor material;

a first-conductivity-type source or emitter region surrounded by a second-conductivity-type body region, formed in the first semiconductor material;

a first-conductivity-type drift region abutting the body region, and formed in the second semiconductor material;

a gate which is positioned in a first trench within at least said first semiconductor material, and is capacitively coupled to control vertical conduction from the source region through portions of the body region near said trench, wherein the first semiconductor material is silicon, the second semiconductor material is a III-N semiconductor material, and the third semiconductor material is a Group IV semiconductor material.

16. A semiconductor device structure, comprising:

at least one layer of a first semiconductor material epitaxially overlying at least one layer of a second semiconductor material which epitaxially overlies at least one layer of a third semiconductor material which epitaxially overlies at least one layer of a fourth semiconductor material;

wherein the first and third semiconductor materials are each different from the second semiconductor material, and the fourth semiconductor material is different from the third semiconductor material;

a first-conductivity-type source or emitter region which is ohmically connected to a first current-carrying metallization, and which is surrounded by a second-conductivity-type body region, formed in the first semiconductor material;

a first-conductivity-type drift region abutting the body region, and formed in the second semiconductor material;

a gate which is positioned in a first trench within at least said first semiconductor material, and is capacitively coupled to control vertical conduction from the source region through portions of the body region near said trench, and thereby through portions of the drift region;
a first-conductivity-type portion of the third semiconductor material;
and a second current-carrying metallization which is connected to the first-conductivity-type portion of the third semiconductor material through a portion of the fourth semiconductor material.

* * * * *